United States Patent [19]

Kondo et al.

[11] Patent Number: 5,599,648
[45] Date of Patent: Feb. 4, 1997

[54] SURFACE REFORMING METHOD, PROCESS FOR PRODUCTION OF PRINTING PLATE, PRINTING PLATE AND PRINTING PROCESS

[75] Inventors: Yuji Kondo; Masato Katayama, both of Yokohama; Akihiro Mouri, Kokubunji, all of Japan

[73] Assignee: Canon Kabushiki Kaisha, Tokyo, Japan

[21] Appl. No.: 157,431

[22] Filed: Nov. 26, 1993

Related U.S. Application Data

[63] Continuation of Ser. No. 740,630, Aug. 5, 1991, abandoned.

[30]  Foreign Application Priority Data

| Aug. 3, 1990 | [JP] | Japan | 2-206616 |
| Nov. 20, 1990 | [JP] | Japan | 2-316262 |
| Nov. 20, 1990 | [JP] | Japan | 2-316263 |

[51] Int. Cl.⁶ ............................. G03C 1/805; B41C 1/00
[52] U.S. Cl. ................... 430/256; 430/262; 430/263; 430/264; 430/291; 430/300; 430/302; 430/309; 430/327; 430/328; 430/330; 430/350; 430/353; 101/463.1; 101/467
[58] Field of Search ..................... 430/256, 260, 430/259, 262, 263, 264, 258, 350, 353, 330, 328, 327, 309, 303, 302, 300, 281, 291, 292, 293, 273, 950, 935, 257; 101/467, 466, 465, 463.1, 456; 156/234, 235, 247, 275.5; 427/510, 555, 559

[56] References Cited

U.S. PATENT DOCUMENTS

| 3,589,903 | 6/1971 | Birkeland | 96/67 |
| 3,615,533 | 10/1971 | Rauner et al. | 96/67 |
| 3,672,904 | 6/1972 | deMauriac | 96/114.1 |
| 3,679,426 | 7/1972 | Youngquist | 96/114.1 |
| 3,751,252 | 8/1973 | Smith et al. | 96/63 |

(List continued on next page.)

FOREIGN PATENT DOCUMENTS

| 786086 | 3/1972 | Belgium . | |
| 39978 | 1/1983 | European Pat. Off. . | |
| 222045 | 5/1987 | European Pat. Off. . | |
| 0426192 | 5/1991 | European Pat. Off. | 430/281 |
| 3621477 | 1/1987 | Germany . | |
| 0258671 | 7/1988 | Germany | 430/302 |
| 42-18416 | 9/1967 | Japan . | |
| 44-30271 | 12/1969 | Japan . | |

(List continued on next page.)

OTHER PUBLICATIONS

"The Non-silver Salt Volume"—Basic Photographic Engineering, 1982 p. 247 (no English translation available).
Journal of Applied Physics, vol. 47, No. 1, pp. 144–147 (Jan. 1976).
Colloid and Polymer Science, vol. 258, No. 10, pp. 1099–1103 (Oct. 1980).
Derwent abstract of Belgium Patent 786086 (1973).
Patent & Trademark Office English–Language Translation of Japanese Patent 1–186400 (Pub Jul. 1989) .
Patent & Trademark Office English–Language Translation of Japanese Patent 1–253498 (Pub Oct. 1989).

*Primary Examiner*—Janis L. Dote
*Attorney, Agent, or Firm*—Fitzpatrick, Cella, Harper & Scinto

[57]  ABSTRACT

Surface reforming of a polymeric article containing a polymerizable compound is effectively performed by polymerizing the polymeric article in contact with a surface reforming medium because the transfer of the material constituting the surface reforming medium to the polymeric article is enhanced by the polymerization. The surface reforming can be performed locally selectively, i.e., imagewise. The remaining un-polymerized part may be subjected to further surface reforming, e.g., by using another type of surface reforming medium or attachment of powder, to provide an enhanced contrast of surface property. Such an enhanced contrast of surface property can be effectively used, e.g., for production of a printing plate.

8 Claims, 6 Drawing Sheets

U.S. PATENT DOCUMENTS

| | | | |
|---|---|---|---|
| 3,751,255 | 8/1973 | Wilson et al. | 96/66 |
| 3,756,829 | 9/1973 | Ohkubo et al. | 96/114.1 |
| 3,770,448 | 11/1973 | Poot et al. | 96/114.1 |
| 3,773,512 | 11/1973 | Poot et al. | 96/48 |
| 3,782,949 | 1/1974 | Olivares et al. | 96/76 |
| 3,794,488 | 2/1974 | Henn et al. | 96/50 |
| 3,801,321 | 4/1974 | Evans et al. | 96/48 |
| 3,819,382 | 6/1974 | Von König et al. | 96/114.1 |
| 3,827,889 | 8/1974 | Ohkubo et al. | 96/114.1 |
| 3,839,048 | 10/1974 | Pool et al. | 96/114.1 |
| 3,887,376 | 6/1975 | Wilson et al. | 96/66 |
| 3,887,378 | 6/1975 | Klein et al. | 96/114.1 |
| 3,893,863 | 7/1975 | Wilson et al. | 96/95 |
| 3,928,686 | 12/1975 | Poot et al. | 428/457 |
| 4,123,274 | 10/1978 | Knight et al. | 96/114.1 |
| 4,220,709 | 9/1980 | deMauriac | 430/353 |
| 4,229,518 | 10/1980 | Gray et al. | 430/273 |
| 4,268,611 | 5/1981 | Okishi et al. | 430/273 |
| 4,284,703 | 8/1981 | Inoue et al. | 430/253 |
| 4,545,831 | 10/1985 | Ornstein | 156/57 |
| 4,559,292 | 12/1985 | Geissler et al. | 430/273 |
| 4,935,331 | 6/1990 | Platzer et al. | 430/256 |
| 4,985,339 | 1/1991 | Koizumi et al. | 430/281 |

FOREIGN PATENT DOCUMENTS

| | | | |
|---|---|---|---|
| 50-16023 | 2/1975 | Japan . | |
| 50-36110 | 4/1975 | Japan . | |
| 50-36143 | 4/1975 | Japan . | |
| 50-99719 | 8/1975 | Japan . | |
| 50-140113 | 11/1975 | Japan . | |
| 50-147711 | 11/1975 | Japan . | |
| 51-23721 | 2/1976 | Japan . | |
| 51-22431 | 2/1976 | Japan . | |
| 51-32324 | 3/1976 | Japan . | |
| 51-51933 | 5/1976 | Japan . | |
| 51-35851 | 10/1976 | Japan . | |
| 52-84727 | 7/1977 | Japan . | |
| 58-118638 | 7/1983 | Japan . | |
| 58-118639 | 7/1983 | Japan . | |
| 58-121031 | 7/1983 | Japan . | |
| 59-55429 | 3/1984 | Japan . | |
| 60-132760 | 7/1985 | Japan | 101/467 |
| 1-186400 | 7/1989 | Japan | 156/234 |
| 01238935 | 9/1989 | Japan . | |
| 01267093 | 10/1989 | Japan . | |
| 01269593 | 10/1989 | Japan . | |
| 1-253498 | 10/1989 | Japan | 156/234 |
| 01306855 | 12/1989 | Japan . | |
| 01306856 | 12/1989 | Japan . | |
| 02-72 | 1/1990 | Japan . | |
| 02-80472 | 3/1990 | Japan . | |
| 02105873 | 4/1990 | Japan . | |
| 02107678 | 4/1990 | Japan . | |
| 02110119 | 4/1990 | Japan . | |
| 02134636 | 5/1990 | Japan . | |
| 2134636 | 5/1990 | Japan . | |

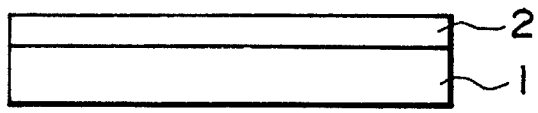
F I G. 1
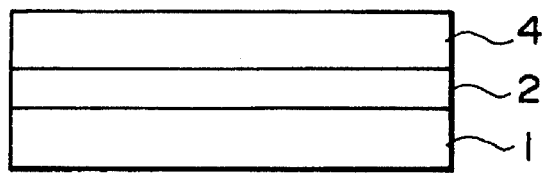
F I G. 2
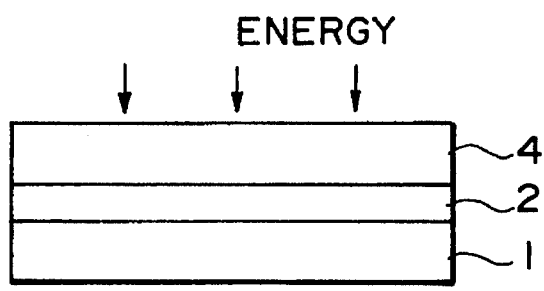
F I G. 3
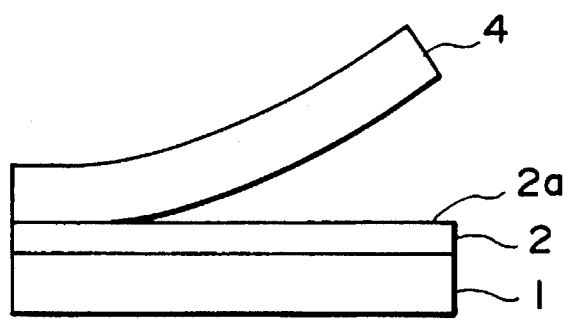
F I G. 4

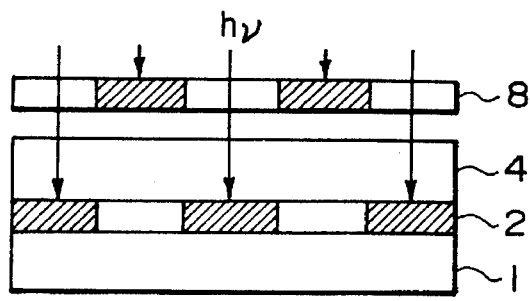
F I G. 5
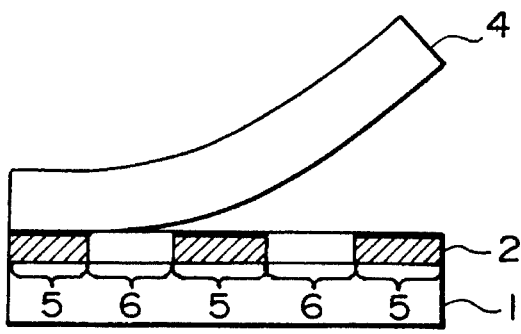
F I G. 6
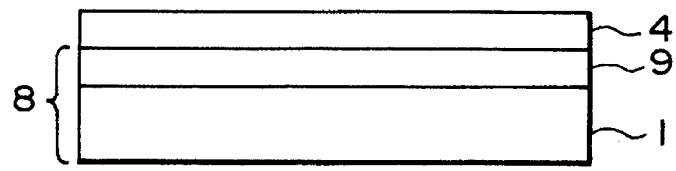
F I G. 7
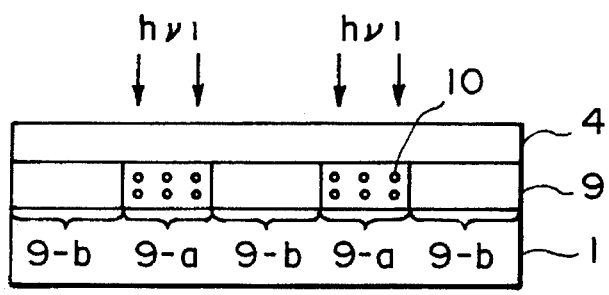
F I G. 8

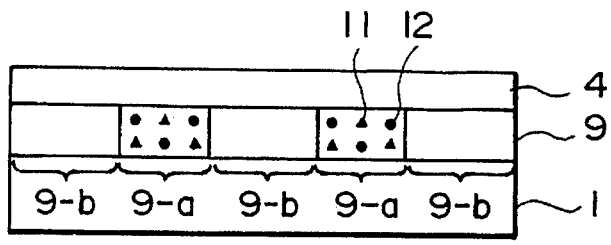
F I G. 9
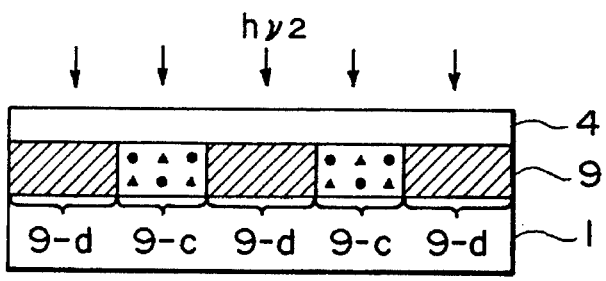
F I G. 10
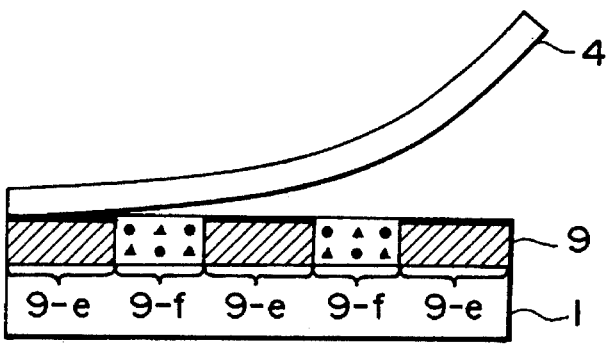
F I G. 11
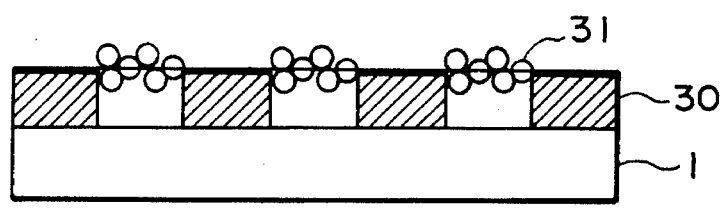
F I G. 12

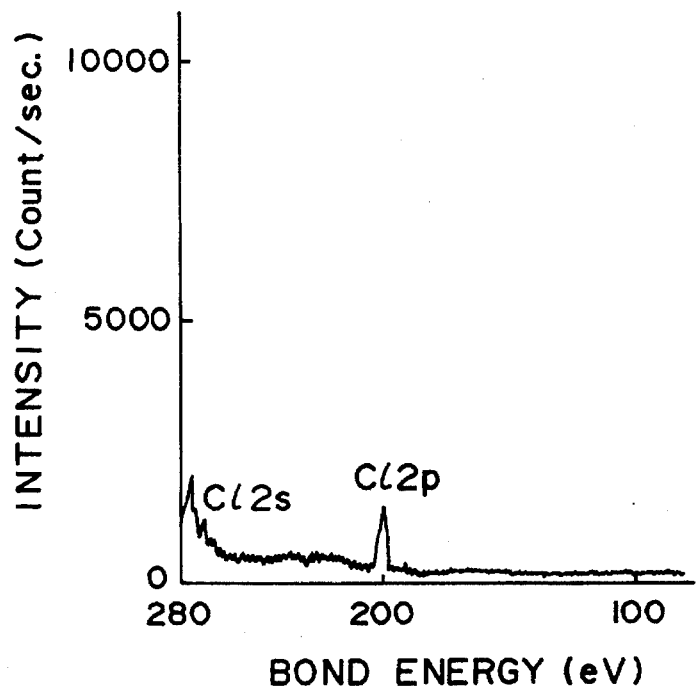
F I G. 16
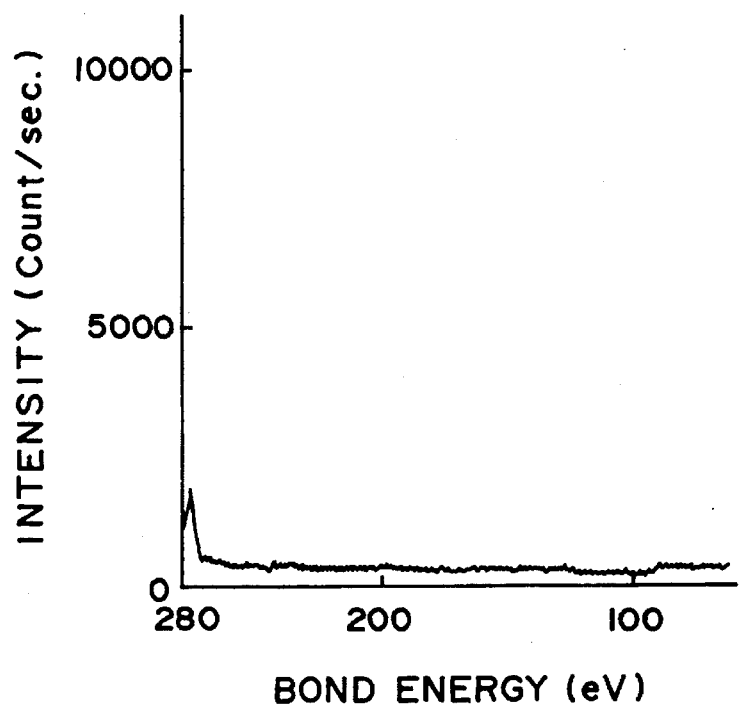
F I G. 17

SURFACE REFORMING METHOD, PROCESS FOR PRODUCTION OF PRINTING PLATE, PRINTING PLATE AND PRINTING PROCESS

This application is a continuation of application Ser. No. 07/740,630 filed Aug. 5, 1991, now abandoned.

FIELD OF THE INVENTION AND RELATED ART

The present invention relates to a surface reforming method of reforming the surface of a polymeric article, etc., a process for producing a printing plate, a printing plate thus produced, and a printing process using the printing plate.

In the use of a polymeric article, it has sometimes been practiced to reform or modify the surface properties of the polymeric article for the purpose of improving adhesiveness, scratch resistance, printability, coatability and biological affinity, provision of antistatic property, etc. Such surface reforming of a polymeric article is generally performed by modification of the surface composition, addition of a functional group, control of the surface shape, or coating with an inorganic or organic material layer. Such conventional surface reforming methods may be roughly classified into chemical reforming methods, physical reforming methods and mechanical reforming methods.

The chemical reforming methods may include: treatment with a chemical agent or solvent, formation of a surface layer by dipping within a silane-type or titanate-type coupling agent, formation of a polymerized film from a monomer, vapor treatment, surface grafting, electrochemical treatment within an electrolyte for reduction, and addition of a surface-migrating substance, such as a surfactant.

The physical reforming methods may include: irradiation with ultraviolet rays, plasma contact treatment, plasma jet treatment, plasma polymerization treatment, sputter etching treatment, and surface coating according to the PVD process or CVD process.

The mechanical methods may include: surface roughening methods, such as liquid honing, shot blasting and tumbling, and treatment utilizing a mechano-chemical effect.

Apart from the above-mentioned conventional surface reforming methods, there is also known a mass transfer phenomenon of polytetrafluoroethylene as a phenomenon of a material being transferred to another material. This is a phenomenon whereby polytetrafluoroethylene is transferred to the surface of a polymer film or shaped product. For example, there is reported a phenomenon that polytetrafluoroethylene was transferred onto a polyethylene terephthalate film when a polytetrafluoroethylene film was caused to slightly contact the polyethylene terephthalate film, in Journal of Applied Physics, Vol. 47, No. 1, pp. 144–147 (1976). There is also reported a phenomenon that polytetrafluoroethylene was transferred to a vinyl chloride-vinyl acetate copolymer when the copolymer was thermally shaped on a substrate of polytetrafluoroethylene, in Colloid and Polymer Science, Vol. 258, No. 10, pp. 1099–1103.

The conventional chemical reforming methods, however, involve difficulties, such as complicated maintenance of the apparatus and environmental pollution. Further, the reforming with an additive involves a problem of compatibility with the base polymer and appropriate selection from many additives.

On the other hand, many of the conventional physical reforming methods are performed in an vacuum atmosphere so that they require complicated apparatus and are time-consuming. Further, the irradiation with ultraviolet rays does not require a vacuum system but is only effective for formation of oxygen-containing functional groups and is not applicable to other types of reforming. Further, regarding the plasma contact treatment, the corona discharge, for example, involves a problem that the surface reformed part loses its effect in a relatively short period and does not have durability.

Further, it is extremely difficult to reform the surface of a polymeric article locally selectively (pattern-wise) by any of the chemical reforming methods and the physical reforming methods.

There is also known a phenomenon that, in melt forming of a polymeric article, the polymeric article causes a change in surface crystallinity depending on the material contacting the polymeric article. Also in this case, it is difficult to change the crystallinity locally selectively.

Further, in case of utilizing the above-mentioned mass transfer of polytetrafluoroethylene, only a small amount is transferred, thus failing to provide a reformed part with a durability, when polytetrafluoroethylene is caused to simply contact a polymeric article. It is also difficult to cause a locally selective transfer. Further, in case of thermal formation of a polymeric article in a polytetrafluoroethylene mold to cause a transfer of polytetrafluoroethylene to the surface of the polymeric article, it is difficult to cause a locally selective transfer of polytetrafluoroethylene to the shaped polymeric article.

On the other hand, in conventional lithographic printing utilizing the immiscibility of water and oil, a hydrophilic non-image part and a hydrophobic image part are formed on a lithographic plate. At the time of printing, dampening water is applied and held at the non-image part so as to enhance the ink repulsion at the non-image part and, in this state, an oily ink is applied to the printing plate to be repulsed by the dampening water at the non-image part and selectively attached to the image part. The resultant ink image on the lithographic plate is transferred directly or indirectly through a blanket cylinder to paper, etc.

Examples of the lithographic plate used in lithography may include: wipe-on plates, PS plates, multi-layer lithographic plates and deep etched plates. These plates are all formed by applying a layer of photosensitive substance onto a sheet of a metal, such as aluminum or zinc and subjecting the photosensitive substance to imagewise exposure and development to form an image on the metal sheet.

There are further known plates for Driography developed by 3M Co. using no dampening water, and waterless lithographic plates developed by Toray K. K. and Dainippon Insatsu K. K. These plates utilize an ink repulsion of a silicone rubber and are formed by disposing a silicone rubber layer on a metal sheet, such as aluminum, followed similarly by exposure and development to form an image. Further, a waterless lithographic plate using a fluorine-containing plate instead of silicone rubber has also been proposed.

Further, in the field of printing providing a small number of prints, it has been known to use a lithographic plate utilizing a silver salt and a lithographic plate utilizing an electrophotographic process.

As an example of the lithographic plate utilizing a silver salt, there is well known Silver Master (trade name) available from Mitsubishi Seishi K. K., which is produced through a silver salt diffusion and transfer (DTR) process. More specifically, the exposed part of the emulsion layer is caused to contain black silver to form an insoluble hydrophilic surface having a minute unevenness after development. On the other hand, silver halide at the un-exposed part is dissolved at the time of development to diffuse and migrate to the surface of the plate, thus forming a lipophilic film to provide a lithographic plate.

The lithographic plate according to the DTR process has an insufficient resistance to mechanical wearing. As a result, the water-repellent part carrying an ink can be partly lacked to cause a deterioration in image quality of the printed images or gradually loses its ink-acceptability, thus providing a poor printing durability. Further, the hydrophilic part also becomes hydrophobic gradually due to mechanical wearing, to result in attachment of an ink to the non-image part causing fog.

SUMMARY OF THE INVENTION

An object of the present invention is to provide a surface reforming method capable of reforming the entire or selectively a part of the surface of a polymeric article through a simple and quick dry treatment so that the surface property provided by the reforming can be retained for a long time.

Another object of the present invention is to provide a process for simply and quickly producing a printing plate by utilizing the surface reforming method.

A further object of the present invention is to provide a printing plate capable of providing a large contrast between the image part and the non-image part through such a process.

A still further object of the present invention is to provide a printing process using such a printing plate.

According to the present invention, there is provided a surface reforming method, comprising:

(a) a contact step of causing a surface reforming medium to contact a polymeric article comprising at least a polymerizable compound;

(b) a polymerization step of polymerizing the polymeric article; and (c) a separation step of separating the surface reforming medium from the polymeric article.

According to another aspect of the present invention, there is provided a process for producing a printing plate utilizing the above-mentioned surface reforming method for provision of a pattern of wettability with water. More specifically, the process is characterized by comprising:

(m) a contact step of causing a surface reforming medium to contact a polymeric article comprising at least a polymerizable compound;

(n) a polymerization step of locally selectively polymerizing the polymeric article; and (o) a separation step of separating the surface reforming medium from the polymeric article to provide the polymeric article with a pattern of different wettability with water.

The present invention further provides a printing plate produced by the above process.

The present invention further provides a printing process, comprising: applying an ink to the above printing plate; and transferring the ink distributed in a pattern on the printing plate to a recording medium.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a side view of a polymeric article used in the present invention.

FIG. 2 is a side view for illustration of a contact step wherein a surface reforming medium is caused to contact the polymeric article shown in FIG. 1 to form a laminate.

FIG. 3 is a side view for illustration of a polymerization step wherein the laminate of the polymeric article and the surface reforming medium shown in FIG. 2 is imparted with energy to cause a polymerization in the polymeric article.

FIG. 4 is a side view for illustration of a separation step wherein the surface reforming medium is separated from the polymeric article.

FIG. 5 is a side view for illustration of another embodiment of the polymerization step shown in FIG. 3.

FIG. 6 is a side view for another embodiment of the separation step shown in FIG. 4.

FIG. 7 is a side view for illustration of the contact step wherein a surface reforming medium is caused to contact a polymeric article containing a silver salt to form a laminate.

FIG. 8 is a side view for illustration of an imagewise exposure step wherein the laminate shown in FIG. 7 is imparted with a pattern of light.

FIG. 9 is a side view for illustration of a thermal development step of applying a heat to the silver salt-containing polymeric article.

FIG. 10 is a side view for illustration of a polymerization exposure step wherein the laminate of the silver salt-containing polymeric article and the surface reforming medium is imparted with light to cause a polymerization in the polymeric article.

FIG. 11 is a side view for illustration of a separation step wherein the surface reforming medium is separated from the silver salt-containing polymeric article.

FIG. 12 is a schematic side illustration of a polymeric article having a reformed surface part according to the present invention.

FIGS. 16 and 17 are graphs showing results of surface analysis of a polymeric article in Example 5 appearing hereinafter.

DETAILED DESCRIPTION OF THE INVENTION

Figure 13:
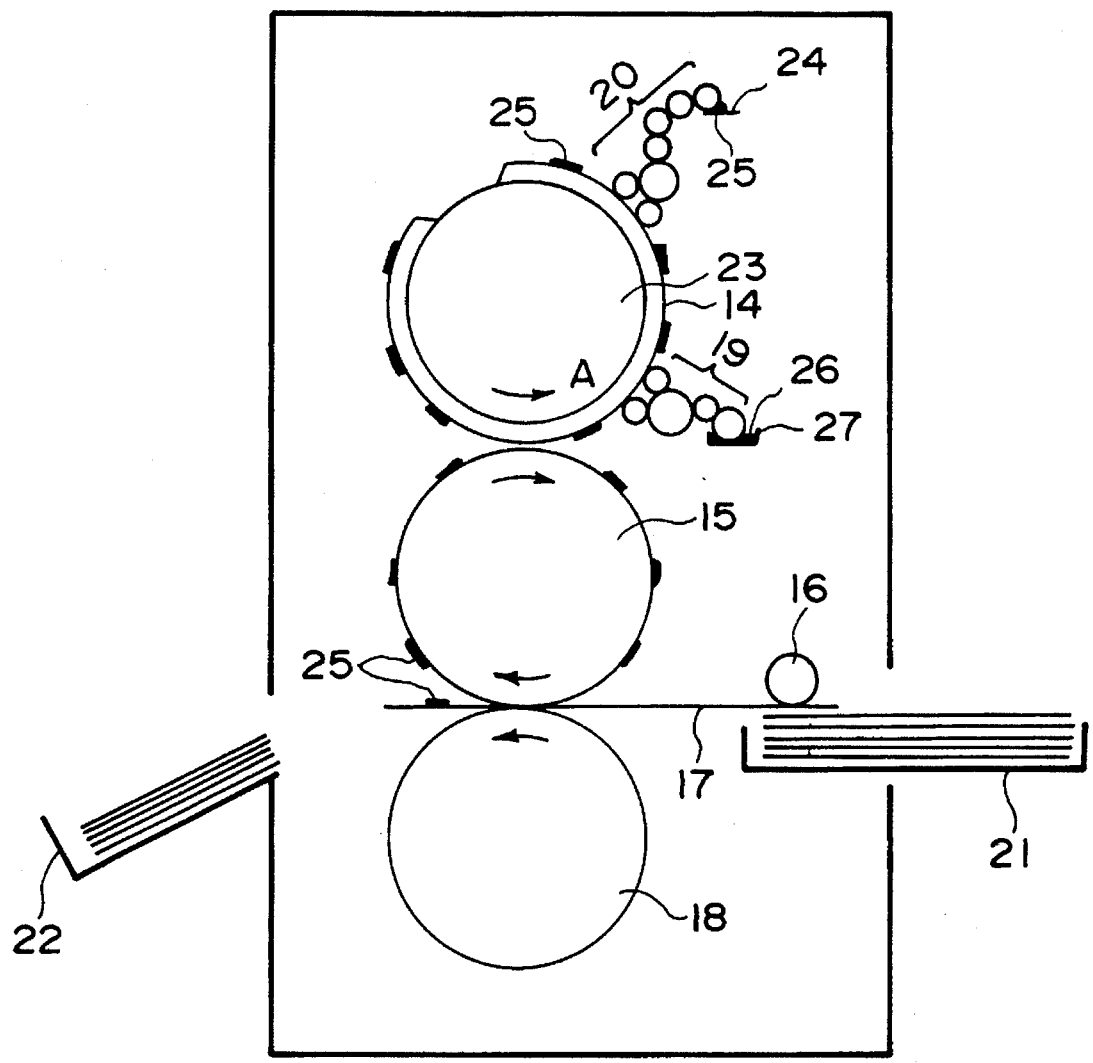
FIG. 13 is a side illustration of an embodiment of a printing apparatus including a printing plate produced by the present invention.

According to the surface reforming method of the present invention, the polymerizable compound is polymerized so that a much larger quantity of surface reforming fractions such as a functional group or atom can be transferred into the surface of the polymeric article from the surface reforming medium than in the case where such a surface reforming medium is caused to simply contact the polymeric article. Further, by polymerizing the polymerizable compound locally selectively by application of energies, such as light and/or heat, the surface reforming of the polymeric article can be performed locally selectively. Further, the property of the reformed part is retained for a long period.

The surface reforming medium used in the present invention comprises a substance having surface reforming fractions such as functional groups and/or atoms to be transferred to the surface of the polymeric article. The surface reforming medium can be prepared by forming such a substance in the form of a film or a roller or by applying such a substance onto a substrate of polyethylene terephthalate, etc.

The polymeric article used in the present invention comprises at least a polymerizable compound, which causes a polymerization when provided with an energy. The polymeric article may contain a polymerization initiator as desired. The polymeric article may generally assume a form of layer 2 disposed on a support 1 as shown in FIG. 1. If the polymeric article or layer 2 has a shape-retaining property, the support 1 is unnecessary.

In order to reform the surface of the polymeric article 2, a desired surface reforming medium 4 is caused to contact the surface of the polymeric article 2 in a contact step as shown in FIG. 2. The surface reforming medium 4 may be appropriately selected depending on how the surface of the polymeric article 2 is reformed or modified.

Then, the polymeric article 2 is imparted with an energy to cause a polymerization in the polymeric article 2 in a polymerization step as shown in FIG. 3.

The energy used in the polymerization step may preferably comprise light, heat, a combination of heat and light, or electron beam.

FIG. 3 illustrates an embodiment wherein the polymeric article 2 contains a photopolymerization initiator and is exposed to light incident from the surface reforming medium 4 side and containing a wavelength fraction absorbable by the photopolymerization initiator to polymerize the polymerizable compound in the polymeric article 2. The wavelength of light suitable for polymerizing the polymerizable compound may preferably be in the range of about 300–600 nm. If the surface reforming medium 4 lacks in light-transmissivity, the exposure may be performed from the support 1 side. When light is used as an energy in the polymerization step, at least one of the surface reforming medium 4 and the support 1 is required to be light transmissive.

In the embodiment of FIG. 3, the entire surface of the polymeric article 2 is exposed, but the polymeric article 2 can be locally selectively (pattern-wise) imparted with an energy through a mask 8. In this case, the surface of the polymeric article 2 may be locally selectively reformed depending on the pattern of the mask 8 as will be described hereinafter.

The mask 8 is not restricted to one having only a transmissive part and a non-transmissive part but can be a gradation mask having a semi-transmissive part like a photographic negative film. The gradation mask may, for example, be one formed by coating a transparent substrate with a polymer liquid crystal imparted with a pattern of transmission and scattering, a lith film or a negative film. By performing an analog exposure through such a mask, it is possible to effect a surface reforming having a gradation characteristic depending on the mask pattern. In other words, the degree of surface reforming can be changed in a gradational fashion.

The exposure light source used in the polymerization step may for example be sunlight, a tungsten lamp, a mercury lamp, a halogen lamp, a xenon lamp, and a fluorescent lamp.

Instead of using such a mask as described above, it is possible to use a liquid crystal-shutter array, a CRT, an optical fiber tube, an LED and a laser as a direct exposure source capable of pattern-wise exposure. In the case where a laser is used as an exposure light source, it is very effective to convert a laser beam into a shorter wavelength by using a non-linear optical device (SHG device).

In the case of polymerization utilizing light in the polymerization step, it is preferred to effect the exposure while heating the polymeric article (bias heating) in order to accelerate the polymerization.

The bias heating may be performed by a hot plate, a heat roller, a thermal head, a heat pen, an infrared light source, or a laser. It is also possible to effect the bias heating by using a support 1 capable generating a heat on current conduction and passing a current through the support 1.

In case where the polymeric article 2 contains a thermal polymerization initiator, the polymerization in the polymeric article 2 may be performed by applying heat from the surface reforming medium 4 side or the support 1 side in the polymerization step. The heating means used for this purpose may be similar to those used for the bias heating. Among the bias heating means, a heating means capable of local heating such as a thermal head or a heat pen may be used to effect a locally selective surface reforming.

Incidentally, the term "polymerization" is used herein also to mean "crosslinking".

After the polymerization step, the surface reforming medium 4 is separated from the polymeric article 2 to provide the polymeric article 2 with a reformed surface part in a separation step as shown in FIG. 4.

While it has not been fully clarified as yet why the surface 2a of the polymeric article 2 is reformed, it is supposed that a fraction of the surface reforming medium 4 is taken into the polymeric article 2 by entanglement thereof with the polymerized network structure of the polymeric article 2 or by bonding to the polymeric article 2 when the polymerization is caused in the polymeric article 2. For this reason, the resultant reformed surface property is retained for a long period of time unlike the mass transfer phenomenon of polytetrafluoroethylene where two materials are simply caused to contact each other. Further, in the case of transferring a fraction of the surface reforming medium through utilization of polymerization, a much larger quantity can be transferred than in the case of the mass transfer phenomenon.

The separation of the surface reforming medium 4 from the polymeric article 2 may be performed in various manners while it depends on the adhesive strength acting between the polymeric article 2 and the surface reforming medium 4. For example, the separation may be performed by peeling the surface reforming medium 4 by using an ordinary mechanical peeling means, such as a claw-shaped member or by suction or adhesion, or by dissolving only the surface reforming medium 4 with a solvent, etc.

The surface reforming of the polymeric article may be performed in the above-described manner. The reformed surface part of the polymeric article depends on the part of the polymeric article polymerized in the polymerization step. When the entire surface of the polymeric article 2 is polymerized as shown in FIG. 3, the entire surface is reformed as shown in FIG. 4. When the polymeric article 2 is locally selectively polymerized by using a mask 8 as shown in FIG. 5, the surface at the polymerized part 5 is reformed, and the surface at the non-polymerized part 6 remains un-reformed as shown in FIG. 6. Accordingly, the surface reforming is performed locally selectively.

Further, if the polymeric article 2 subjected to a pattern-wise surface reforming is further subjected to the surface reforming operations according to the present invention as explained with reference to FIGS. 2 to 6, the surface of the polymeric article 2 can be reformed into a mixture of parts having different surface properties. More specifically, after peeling off the surface reforming medium 4 as shown in FIG. 6, if the polymeric article 2 subjected to the locally selective surface reforming is further covered with a surface reforming medium having a different surface reforming fraction, such as a different functional group or atom, and then again subjected to the steps described with reference to FIGS. 3 and 4, the non-polymerized parts 6 of the polymeric article 2 are polymerized to be surface-reformed in a different degree from the already polymerized parts 5, whereby the polymeric article 2 acquires a desired pattern of surface-reformed parts.

Further, after peeling off the surface reforming medium 4 as shown in FIG. 6, if the polymeric article 2 subjected to the locally selective surface reforming is further covered with a surface reforming medium having a different surface reforming fraction, such as a different functional group or atom, and then again subjected to a locally selective surface reforming as explained with reference to FIGS. 5 and 6 by using a mask having a different pattern to polymerize the un-polymerized parts 6 in a different pattern and form thereat differently surface-reformed parts. By further repeating the steps explained with reference to FIGS. 5 and 6, the polymeric article 2 can be surface-reformed in three or more degrees in a pattern.

It is preferred that no un-polymerized parts are left on the polymeric article 2 after the surface reforming. The surface of a polymeric article can show an excellent durability if the surface is entirely polymerized. For this reason, in case where any un-polymerized parts are left on the surface of the polymeric article after the surface reforming, it is preferred to expose the entirety of the polymeric article 2 to light and/or heat to polymerize the entire surface of the polymeric article.

As briefly mentioned earlier, the polymeric article 2 comprises at least a polymerizable compound. The polymerizable compound may be a compound having at least one reactive vinyl group in its molecule and may comprise one or more species selected from reactive vinyl group-containing monomers, reactive vinyl group-containing oligomers and reactive vinyl group-containing polymers. The reactive vinyl group in these compounds includes substituted or unsubstituted vinyl groups having polymerization reactivity, as exemplified by styrene type vinyl groups, acrylic acid type vinyl groups, methacrylic acid type vinyl groups, allyl type vinyl groups, and vinyl ether type vinyl groups, as well as ester vinyl groups as in vinyl acetate.

Examples of the polymerizable compound satisfying such conditions may include, for example:

monofunctional monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether;

difunctional monomers such as divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α,α'-dichloroglutarate, distyryl terephthalate, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), β,β'-dimethylglutaric acid di(ethyl methacrylate), 1,4-phenylenebis(oxyethyl methacrylate), and 1,4-bis(methacryloyloxyethoxy)cyclohexane acryloyloxyethoxyethyl vinyl ether;

trifunctional monomers such as pentaerythritol triacrylate, pentaerythritol trimethacrylate, pentaerythritol tri(hydroxystyrene), cyanuric acid triacrylate, cyarnuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethylacrylate), dipentaerythritol hexaacrylate, cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product pattern 1,1,1-trimethylolpropane and three-fold moles of hexanediisocyanate, with p-hydroxystyrene;

tetrafunctional monomers such as ethylenetetraacrylamide, propylenetetraacrylamide, and pentaerythritol tetraacrylate; pentafunctional monomers, such as dipentaerythritol monohydroxypentaacrylate; hexafunctional monomers, such as dipentaerythritol hexaacrylate; and further oligomers or polymers having remaining terminal vinyl groups, and oligomers or polymers having side groups including reactive vinyl groups attached thereto. Two or more of these polymerizable compounds can be used in combination.

The polymeric article 2 used in the present invention may comprise a polymerization initiator, which may be a photopolymerization initiator and/or a thermal polymerization initiator.

The thermal polymerization initiator may be a known initiator, examples of which may include: azo initiators and peroxide initiators. An azo initiator is an organic compound having at least one nitrogen—nitrogen double bond, and examples thereof may include: azobisisobutyronitrile, azobiscyclohexanecarbonitrile, azobismethylphenetylcarbonitrile, azobis-secamylonitrile, azobisphenylethane, azobixcyclohexylpropylonitrole, azobismethylchloroethane, tritylazobenzene, phenylazoisobutyronitrile, and 9-(p-nitrophenylazo)-9-phenylfluorene. Further, a peroxide initiator may be almost any compound having at least one oxygen—oxygen bond, and examples thereof may include: methyl ethyl ketone peroxide, cyclohexane peroxide, 3,3,5-trimethylcyclohexanone peroxide, methylcyclohexanone peroxide, acetylacetone peroxide, 1,1'-bis(tert-butylperoxy)cyclohexane, n-butyl-4,4-bis(tert-butylperoxy)valerate, 2,2'-bis(tert-butylperoxy)butane, tert-butyl hydroperoxide, cumene hydroperoxide, 2,5-dimethylhexane-2-dihydroperoxide, 1,1,3,3-tetramethylbutyl hydroperoxide, di-tert-butyl peroxide, tert-butylcumyl peroxide, dicumyl peroxide, α,α'-bis(tert-butylperoxyisopropyl)benzene, 2,5-dimethyl-2,5-di(tert-butylperoxy)hexane, 2,5-dimethyl-2,5-di(tert-butylperoxy)hexyne-3, acetyl peroxide, isobutyl peroxide, octanoyl peroxide, decanoyl peroxide, lauroyl peroxide, 3,5,5-trimethylhexanoyl peroxide, succinic acid peroxide, benzoyl peroxide, 2,4-dichlorobenzoyl peroxide, m-toluoyl peroxide, diisopropyl peroxydicarbonate, di-2-ethylhexylperoxydicarbonate, di-n-propyl peroxydicarbonate, di-2-ethoxyethyl peroxydicarbonate, dimethoxyisopropyl peroxydicarbonate, di(3-methyl-3-methoxybutyl) peroxydicarbonate, tert-butyl peroxyacetate, tert-butyl peroxyisobutyrate, tert-butyl peroxypivalate, tert-butyl peroxyneodecanoate, tert-butyl peroxyoctanoate, tert-butyl peroxy-2,5,5-trimethylhexanoate, tert-butyl peroxylaurate, tert-butyl peroxybenzoate, di-tert-butyldiperoxyisophthalate, 2,5-dimethyl-2,5-di(benzoylperoxy)hexane, tert-butyl peroxymaleate, and tert-peroxyisopropyl carbonate. The above compounds are not exhaustive and other known thermal polymerization initiators may also be used in the present invention.

The photopolymerization initiator may include, for example, carbonyl compounds, sulfur compounds, halogen compounds, and photopolymerization initiators of redox type.

Specifically, the carbonyl compounds include diketones as exemplified by benzyl, 4,4'-dimethoxybenzyl, diacetyl, and camphorquinone; benzophenones as exemplified by 4,4'-(diethylaminobenzophenone, and 4,4'-dimethoxybenzophenone; acetophenones as exemplified by acetophenone, and 4-methoxyacetophenone; benzoin alkyl ethers; thioxanthones as exemplified by 2-chlorothioxanthone, 2,4-dichlorothixanthone, 2,4-diethylthioxanthone, and thioxanthone-3-carboxylic acid-β-methoxy ethyl ester; chalcones and styrylketones having a dialkylamino group; and cumarins as exemlified by 3,3'-carbonylbis(7-methoxycumarin), and 3,3'-carbonylbis(7-diethylaminocumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction.

Such combination of the photopolymerization initiators includes a combination of styryl ketones or chalcones having a dialkylamino group or cumarins, with S-triazines having a trihalomethyl group or camphorquinone.

The polymeric article or layer 2 used in the present invention may be formed by dissolving at least the above-described polymerizable compound and an optional polymerization initiator together with a binder which may be used as desired in a solvent and then removing the solvent.

The binder usable in the polymeric article 2 may be selected from a wide variety of resins, and examples thereof may include: cellulose esters such as nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate;

cellulose ethers such as methyl cellulose, ethyl cellulose, propyl cellulose, and butyl cellulose;

vinyl resins such as polystyrene, polyvinyl chloride, polyvinyl acetate, polyvinyl butyral, polyvinyl acetal, polyvinyl alcohol, and polyvinyl pyrrolidone;

copolymer resins such as a styrene/butadiene copolymer, a styrene/acrylonitrile copolymer, a styrene/butadiene/acrylonitrile copolymer, and a vinyl chloride/vinyl acetate copolymer;

acrylic resins such as polymethyl methacrylate, polymethyl acrylate, polybutyl acrylate, polyacrylic acid, polymethacrylic acid, polyacrylamide, and polyacrylonitrile;

polyesters such as polyethylene terephthalate;

polyarylate resins such as poly(4,4'-isopropylidenediphenylene-co-1,4-cyclohexylenedimethylene carbonate), poly-(ethylenedioxy-3,3'-phenylene thiocarbonate), poly(4,4'-isopropylidenediphenylene carbonate-co-terephthalate), poly(4,4'-isopropylidenediphenylene carbonate), poly(4,4'-secbutylidenediphenylene carbonate), and poly(4,4'-isopropylidenediphenylene carbonate-block-oxyethylene);

plyamides; polyimides; epoxy resins; phenolic resins;

polyolefins such as polyethylene, polypropylene, and chlorinated polyethylene; and natural polymers such as gelatin.

In addition to the above, optional components, such a photocolor change-preventing agent and a solid solvent, may be added as desired to the polymeric article 2.

In the case when the polymeric article or layer 2 is formed on a support 1, the support 1 may be composed of an appropriate material to provide a suitable adhesiveness such that the support 1 and the polymeric article will not be separated when a surface reforming medium as will be described later is peeled off from the polymeric article. For example, the support may be composed of a metal, such as aluminum, zinc, copper, nickel, or brass; a plastic, such as polyethylene terephthalate, polyvinyl chloride or polycarbonate; paper, resin-coated paper or paper coated with a metal foil such as that of aluminum or copper; rubber, glass, or a composite material of the above materials. In order to enhance the adhesion between the support 1 and the polymeric article 2 or for other purposes, it is possible to dispose a intermediate layer, such as a primer layer, between the support 1 at the polymeric article 2.

It is preferred that the polymerizable compound is contained in the polymeric article 2 in a proportion of 5–99 wt. %, further preferably 10–80 wt. %, particularly preferably 20–60 wt. %, of the polymeric article 2. When a polymerization initiator is contained in the polymeric article 2, the polymerization initiator may preferably be contained in a proportion of 0.1–30 wt. parts, particularly 0.3–25 wt. parts, per 100 wt. parts of the polymerizable compound.

The shape and the size of the polymeric article 2 may be arbitrarily selected depending on the use thereof, but generally the polymeric article 2 may preferably be in the form of a layer or sheet (or film) having a thickness in the range of 0.1 micron–2 mm, particularly 1 micron–0.1 mm, except for the support 1. This thickness range is also suitable for a printing plate as will be described later.

The surface reforming medium 4 can comprise various materials depending on the nature of surface reforming. For example, in order to impart a lipophilicity or water-repelling property to the surface of the polymeric article, the surface reforming medium may comprise a resin having a low surface energy, inclusive of: fluorine-containing resins, such as polytetrafluoroethytene, tetrafluoroethyleneperfluoroalkyl vinyl ether copolymer, tetrafluoroethylene-ethylene copolymer, and poly-chlorotrifluoroethylene; and silicone resins. The surface reforming medium 4 may be formed as a film of such a resin or a coating layer of such a resin formed by applying a solution thereof in an appropriate solvent onto an appropriate substrate such as a polyethylene terephthalate film.

In order to impart a hydropholicity or water-retaining property to the surface of the polymeric article, the surface reforming medium may comprise a hydrophilic polymer, inclusive of: plant polymers, such as guar gum, locust bean gum, gum arabic, tragacanth, carrageenan, pectin, mannan, and starch; microorganism polymers, such as xanthane gum, dextrin, succinoglucan, and curdran; animal polymers, such as gelatin, casein, albumin, and collagen; cellulose polymers such as methyl cellulose, ethyl cellulose, and hydroxyethyl cellulose; starch polymers, such as soluble starch, carboxymethyl starch, and methyl starch; alginic acid polymers, such as propylene glycol alginate, and alginic acid salts; other semisynthetic polymers, such as derivatives of polysaccharides; vinyl polymers, such as polyvinyl alcohol, polyvinylpyrolidone, polyvinyl methyl ether, carboxyvinyl polymer, sodium polyacrylate, and polyacrylamide; and other synthetic polymers, such as polyethylene glycol, ethylene oxide-propylene oxide block copolymer; mixture of above polymers with additives, silicon dioxide, titanium dioxide, crosslinking agents and surfactants; hydrophilic polymers as disclosed in Japanese Patent Publication (JP-B) 15383/1990 and Japanese Laid-Open Patent Applications (JP-A) 80472/1990, 105873/1990, 238935/1989, 110119/1990, 107678/1990 and 72/1990; resins which per are hydrophobic but can have hydrophilic groups through hydrolysis or hydrogenolysis in contact with an etchant or dampening water; and resins disclosed in JP-A 306856/1989, 306855/1989, 267093/1989 and 269593/1989. These resins may be used singly or in combination of two or more species.

Further, in order to impart chlorine to the surface of the polymeric article, the surface reforming medium may comprise a chlorine-containing resin, such as polyvinylidene chloride or polyvinyl chloride.

The shape and the size of the surface reforming medium are not particularly limited but may preferably have a thickness of at least 1 micron for effective surface reforming of the polymeric article. On the other hand, the surface reforming medium may preferably have a thickness of at most 2 cm in respect of handling.

When the polymeric article 2 is laminated with the surface reforming medium 4 as shown in FIG. 2, it is preferred to effect the lamination under heating as by passing the polymeric article 2 and the surface reforming medium 4 in lamination through hot rollers. If the polymeric article and the surface reforming medium poorly contact each other and bubbles are allowed to remain between these members, the polymerization of the polymerizable compound can be retarded or even prevented due to quenching of radicals with oxygen thereat. If the polymerization is retarded, the degree of surface reforming may be changed locally unintentionally.

The surface reforming medium need not be always solid but can be liquid. In the case of a liquid surface reforming medium, it is caused to contact the polymeric article by application. Further, the above-described material for the surface reforming medium can be mixed with an appropriate binder to form a surface reforming medium.

In the surface reforming method according to the present invention, the polymeric article 2 can further contain a photosensitive silver salt component, inclusive of a photosensitive silver halide. According to this inclusion, the polymeric article is provided with an improved sensitivity, and a polymerized part and an unpolymerized part can be formed at a higher resolution in the polymeric article. The photosensitive silver salt component does not necessarily mean a single compound, but may include two or more compounds as will be understood from a later description.

The photosensitive silver component can be of either a wet-type or a dry-type but may preferably be of a dry-type, which allows a dry process for the surface reforming and does not require administration of the developer liquid or disposal of the waste liquid. It is preferable to use a dry-type photosensitive silver salt component including at least a photosensitive silver halide, an organic silver salt and a reducing agent.

An embodiment of the surface reforming method using a polymeric article containing such a photosensitive silver salt component (hereinafter called a "silver salt-containing polymeric article") will now be described.

The surface reforming method using such a silver salt-containing polymeric article involves a unique polymerization step utilizing the photosensitivity of a silver halide which is different from the one already described with reference to FIG. 3. The contact or lamination step and the separation step are substantially the same as those in the surface reforming method already described with reference to FIGS. 1–6.

First, in a contact step as shown in FIG. 7, a prescribed surface reforming medium 4 is caused to contact the surface of a silver salt-containing polymeric article. The surface reforming medium 4 is identical to the one already explained hereinabove. The silver salt-containing polymeric article comprises at least a photosensitive silver salt component and a polymerizable compound, and optionally a polymerization initiator. The photosensitive silver salt component comprises at least a photosensitive silver halide, an organic silver salt and a reducing agent in the case of a dry-type one, and comprises at least a photosensitive silver halide in the case of a wet-type one, as will be described later in further detail.

The silver salt-containing polymeric article 9 may generally be formed as a layer on a support 1 as shown in FIG. 7. The support 1 is not necessary if the polymeric article 9 per se has a shape-retaining property.

It is preferred that the polymeric article 9 and the surface reforming medium 4 are caused to contact each other under heating. The heating temperature should be suppressed so as not to cause a thermal fog of the photosensitive silver salt component and may be 30° C.–120° C., preferably 35° C.–90° C., further preferably 35° C.–60° C.

Then, the polymeric article 9 is subjected to polymerization. In this embodiment of the surface reforming method using a silver salt-containing polymeric article containing a photopolymerization initiator. The polymerization is subdivided into at least an imagewise exposure step, a thermal development step and a polymerization exposure step.

In the imagewise exposure step, the polymeric article 9 is first subjected to imagewise exposure with light $hv_1$ in a prescribed pattern. The imagewise exposure may be performed by scanning with a laser beam or by using a mask.

The wavelength of the light for imagewise exposure may preferably be in the range of about 500 nm–1000 nm, further preferably about 500 nm–900 nm, in the case where the silver salt-containing polymeric article contains a sensitizing dye, and in the range of about 300 nm–500 nm in the case where the polymeric article contains no sensitizing dye.

As a result, the photosensitive silver salt at the exposed parts 9-$a$ yields silver nuclei 10 to form a latent image.

In the polymerization step, the imagewise exposure step is followed by a thermal development step. In the thermal development step as shown in FIG. 9, the polymeric article 9 provided with a latent image in the imagewise exposure step is heated to cause a reaction between the organic silver salt and the reducing agent selectively at the exposed parts 9-$a$ in the presence of the silver nuclei 10 acting as a catalyst, whereby the organic silver salt is converted into elemental silver 11 and the reducing agent is converted to an oxidized product 12.

The heating may depend on the composition, etc., of the polymeric article 9 but may generally be performed at 60° C.–200° C. preferably 70° C.–150° C. for 1 sec. to 7 min., preferably for 3 sec. to 60 sec. Generally, a shorter time is sufficient at a higher temperature and a longer time is required at a lower temperature. The heating may be performed by using a heating means, such as a hot plate, a heat roller or a thermal head, electrically energizing a heat generating element on the support, or by heating according to laser light irradiation.

A polymerization exposure step is placed as a final step of the polymerization step. More specifically, as shown in FIG. 10, substantially the entire face of the polymeric article 9 is uniformly exposed to light $hv_2$. As a result, at the un-exposed parts 9-$b$ which have not been irradiated with the light $hv_1$ in the imagewise exposure step, the photopolymerization initiator in the polymeric article 9 is decomposed by the light $hv_2$ to generate radicals, which causes polymerization. On the other hand, at the exposed parts 9-$a$ in the polymeric article 9, the light $hv_2$ is absorbed by the elemental silver 11 and/or the oxidized product 12 or radicals, even if generated by the light $hv_2$, are quenched by the oxidized product. As a result, the polymeric article 9 is caused to have different polymer formation states between the exposed parts 9-$a$ and the un-exposed parts 9-$b$ to result in un-polymerized parts 9-$c$ corresponding to the exposed parts 9-$a$ and polymerized parts 9-$d$ corresponding to the un-exposed parts 9-$b$.

The light source and the mask used in the imagewise exposure step and the polymerization exposure step are identical to those used in the surface reforming method described with reference to FIGS. 1 to 6.

It is possible to use an identical wavelength of light in the imagewise exposure step and the polymerization exposure step because a silver halide has a sufficiently higher photosensitivity than a photopolymerization initiator and can cause a sufficient latent image formation at an intensity of light not causing photopolymerization in the imagewise exposure step. For example, light in an intensity of up to about 1 mJ/cm$^2$ may be used in the imagewise exposure step and light in an intensity of up to about 500 mJ/cm$^2$ may be used in the polymerization exposure step, respectively measured at the surface of the polymeric article 9.

In the polymerization step, it is possible to effect the exposure at an elevated temperature of the polymeric article 9. The elevated temperature may be given by additional heating or by utilizing the remaining heat applied in the previous thermal development step. The temperature should be selected so as not to cause a redox reaction between the organic silver salt and the reducing agent. The elevated temperature can be different depending on the combination of the organic silver salt and the reducing agent but may generally be in the range of 30° C.–120° C., preferably 35° C.–90° C., further preferably 35° C.–60° C.

In the surface reforming method using a silver salt-containing polymeric article, an excellent latent image-writing sensitivity is obtained, and the polymerization of the polymerizable compound is performed by the whole-area exposure to be completed in a short time, the process time from the image writing to the polymerization can be effectively shortened.

In the separation step after the above-described polymerization step, the surface reforming medium 4 is peeled off the polymeric article 9 to provide the polymeric article 9 with surface-reformed parts 9-$e$ and yet un-reformed parts 9-$f$.

The peeling operation is identical to the one explained with reference to FIG. 4.

As described hereinabove, the surface reforming method using a silver salt-containing polymeric article can be regarded as identical to the surface reforming method explained with reference to FIGS. 1–6 except for the polymerization step.

In the case of using a dry-type photosensitive silver salt component containing a thermal polymerization initiator instead of a photopolymerization initiator, the above-mentioned polymerization exposure step becomes unnecessary, and the polymerization step may be completed through the imagewise exposure step and the thermal development step.

In the case of using a wet-type photosensitive silver salt component, the above-mentioned thermal development step is replaced by a wet development step wherein the silver salt-containing polymeric article 9 is dipped in a known developer liquid, which may contain a developing agent as a reducing agent, a promoter, a preservative, a fog-preventing agent, etc.

In the surface reforming method according to the present invention, it is sufficient that the surface reforming medium contacts the polymeric article or silver salt-containing polymeric article when the polymeric article or silver salt-containing polymeric article polymerizes. Accordingly, when a silver salt-containing polymeric article is used in the surface reforming method according to the present invention, it is possible to have the surface reforming medium contact the silver salt-containing polymeric article only after the imagewise exposure step or the thermal development step. Such a mode of causing the surface reforming medium contact during the polymerization step is particularly effective when a wet-type photosensitive silver salt component is used.

It is also possible to form the silver salt-containing polymeric article in a multi-layer structure including a photosensitive silver salt layer comprising the photosensitive silver salt component and a polymerization layer comprising the polymerizable compound and optionally the polymerization initiator. In this case, it is naturally preferred to effect the imagewise exposure from the photosensitive silver salt layer side. Further, it is also possible to form the photosensitive silver salt layer and the polymerization layer on separate supports, perform the imagewise exposure step and the thermal exposure step, and then effect the contact step of laminating the photosensitive silver salt layer and the polymerization layer with each other.

It is also possible to form the photosensitive silver salt layer on a support, form the polymerization layer on the surface reforming medium, and then laminate these members with each other to effect a new type of contact step.

It is also possible to use a united medium which already includes the polymeric article or silver salt-containing polymeric article and the surface reforming medium in contact with each other and then subjecting the united medium to the polymerization step and the separation step. Further, it is also possible to use another united medium comprising the polymerization layer, the surface reforming medium and the photosensitive silver salt layer in this order, or still another united medium comprising the photosensitive silver salt layer, the polymerization layer and the surface reforming medium in this order for the subsequent polymerization step and separation step.

As described above, the silver salt-containing polymeric article 9 is obtained by incorporating a dry-type or wet-type photosensitive silver salt component in the polymeric article 2. Accordingly, the components other than the dry-type or wet-type photosensitive silver salt component are the same as those of the polymeric article 2 described with reference to FIGS. 1-6.

The photosensitive silver salt component, regardless of whether it is of a dry-type or wet-type, comprises a photosensitive silver halide, examples of which may include silver chloride, silver bromide, silver chlorobromide, silver iodobromide, and silver chloroiodobromide. These may be or may have been subjected to chemical sensitization or optical sensitization as done in respect of usual photographic emulsions. More specifically, the chemical sensitization that can be used includes sulfur sensitization, noble metal sensitization, and reduction sensitization. The optical sensitization that can be applied includes methods using conventionally known sensitizing dyes.

The silver halide as a photosensitive salt may have a uniform crystalline structure or a multi-layer crystalline structure having locally different compositions, e.g., one having a core of AgBr covered with an outer layer of AgI. It is also possible to use simultaneously two or more kinds of silver halides having different halogen compositions, grain sizes, grain size distributions, etc.

The dry-type photosensitive silver salt component includes at least an organic silver salt and a reducing agent in addition to the above-mentioned silver halide.

The organic silver salt may include organic acid silver salts or triazole silver salts as described in SHASHIN KOGAKU NO KISO (Basic Photographic Engineering), First Edition, published 1982, The Non-silver Salt Volume, p.247, or Japanese Laid-Open Patent Application JP-A 59-55429. It is preferred to use silver salts having a low or no photosensitivity. They include, for example, silver salts of aliphatic carboxylic acids, aromatic carboxylic acids, thiocarbonyl compounds having a mercapto group or α-hydrogen, and imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid. In general, however, silver salts are less stable as they have a smaller number of carbon atoms, and hence those having an appropriate number of carbon toms (as exemplified by those having 16 to 26 carbon atoms) are preferred.

The aromatic carboxylic acids include benzoic acid derivatives, quinolinic acid derivatives, naphthalenecarboxylic acid derivatives, salicylic acid derivatives, gallic acid, tannic acid, phthalic acid, phenylacetic acid derivatives, and pyromellitic acid.

The compounds having a mercapto group or thiocarbonyl group having α-hydrogen include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atom number of 12 to 23), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication JP-B 44-30271 or JP-B 42-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Laid-Open Patent Application JP-A 58-118638, sulfobenzotriazole, carboxybenxotriazole or salts thereof, or hydroxybenzotriazole, described in Japanese Laid-Open Patent Application JP-A 58-118639, 1,2,4-triazole, described in U.S. Pat. No. 4,220,709, or 1H-tetrazole, carbazole, saccharin, imidazole, and derivatives thereof.

The reducing agent used in a dry system may preferably be a compound which reduces the organic silver salt to produce elemental silver forming a black silver image and which per se is converted into an oxidation product. Such a reducing agent used in a dry system may be appropriately selected depending on the kinds of the polymerization initiator and the organic silver salt used together therewith. In the case where a photopolymerization initiator is used as the polymerization initiator, suitable examples of the reducing agent may include: monophenols, bisphenols, trisphenols, tetrakisphenols, mononaphthols, bisnaphthols, dihydroxynaphthalenes, trihydroxynaphthalenes, dihydroxybenzenes, trihydroxybenzenes, tetrahydroxybenzenes, hydroxyalkyl monoethers, ascorbic acids, 3-pyrazolidones, pyrazolines, pyrazolones, reductive salts, phenylenediamines, hydroxyamines, reductons, hydroxamic acids, hydrazines, amidoximes, and N-hydroxyureas. These reducing agents may be used singly or in combination of two or more species. Specific examples of the reducing agent are disclosed in JP-A 51-22431; U.S. Pat. Nos. 3,615,533; 3,679,426; 3,672,904; 3,751,252; 3,751,255; 3,782,949; 3,801,321; 3,794,488; 3,893,863; 3,887,376; Belgium Patent No. 786,086; U.S. Patents Nos. 3,770,448; 3,819,382; 3,773,512; 3,928,686; 3,839,048; 3,887,378; JP-B 51-35851; JP-A 50-36143; U.S. Pat. Nos. 3,827,889 and 3,756,829; JP-A 50-36110; JP-A 50-16023; JP-A 50-147711; JP-A 51-23721, JP-A 50-99719; JP-A 51-32324; JP-A 51-51933; JP-A 50-140113; JP-A 52-84727; JP-A 63-250174; and U.S. Pat. No. 3,589,903.

In order to obtain a large contrast in respect of light absorption (or transmittance) between the exposed part and the un-exposed part, it is preferred that the oxidation product formed at the exposed part has a large molar decadic absorption coefficient. Preferred examples of the reducing agent providing such an oxidation product may include aromatic hydroxy compounds, specific examples of which are disclosed in Japanese Patent Application No. 260235/1990.

The photosensitive silver salt component may preferably contain a reducing aid having a function of promoting the redox reaction, and examples thereof may include: cyclic imides, such as uracil, N-hydroxynaphthalimide, phthalimide and succinimide; cyclic hydrazides, such as phthalhydrazide and maleic hydrazide; phthalazinediones; phthalazines; and phthalazinones.

Suitable examples of the reducing agent used in combination with the thermal polymerization initiator may include: aminophenol derivatives, such as 1-phenyl-3-pyrazolidone (phenydone), 4-methyl-1-phenyl- 3-pyrazolidone, 4,4-dimethyl-1-phenyl-3-pyrazolidone, 4-ethyl-1-phenyl-3-pyrazolidone, p (or m or o)aminophenol, 2,6-dichloro-p-aminophenol, 2,6-dimethyl-p-aminophenol, and 3,5-dimethyl-p-aminophenol; polyhydroxybenzenes or alkoxyphenols, such as catechols and alkoxyphenols. It is possible to use two or more species of these reducing agents in combination.

In the silver salt-containing polymeric article using a dry-type photosensitive silver salt component, the respective components may preferably be used in the following proportions.

With respect to 1 mol of the organic silver salt, the photosensitive silver halide may preferably be used in 0.001 mol–2 mol, more preferably 0.05 mol–0.4 mol. The reducing agent may preferably be used in 0.2 mol–3 mol, more preferably 0.7 mol–1.3 mol per mol of the organic silver salt. The polymerizable compound may preferably be used in 10–1000 wt. parts, more preferably 20–500 wt. parts per 100 wt. parts of the organic silver salt. In the case where the silver salt-containing polymeric article contains the polymerization initiator, the photopolymerization or thermal polymerization initiator may preferably be used in 0.1–30 wt. parts, more preferably 0.3–25 wt. parts, per 100 wt. parts of the polymerizable compound. The polymerizable compound may preferably be contained in a proportion of 30–80 wt. %, particularly 50–70 wt. %, of the silver salt-containing polymeric article.

The wet-type silver salt component comprises at least the photosensitive silver halide but may optionally contain an inorganic or organic hardening agent, a coating acid, a surfactant, etc., as desired.

In the silver salt-containing polymeric article using a wet-type polymerizable compound silver salt component, the respective components may preferably be used in the following proportions.

The polymerizable compound may preferably be used in 30–80 wt. %, particularly 50–70 wt. %, of the silver salt-containing polymeric article. In the case where the silver salt-containing polymeric article contains the polymerization initiator, the photopolymerization or thermal polymerization initiator may preferably be used in 0.1–30 wt. parts, particularly 0.3–25 wt. parts, per 100 wt. parts of the polymerizable compound. The photosensitive silver halide may preferably be used in ai proportion of 20–70 wt. %, particularly 30–50 wt. %, of the silver salt-containing polymeric article.

The silver salt-containing polymeric article can be provided with a protective layer and/or an antihalation layer similarly as in an ordinary silver salt photosensitive member.

The development promoter may for example be sodium hydroxide, sodium carbonate, trisodium phosphate, sodium metaborate, and borax.

The preservative has a function of preventing the developing agent from losing its developing power due to oxidation with oxygen dissolved from air into the aqueous solution. The preservative may preferably be sodium sulfate, sodium hydrogen-sulfite, etc.

The fog-preventing agent may generally be potassium bromide but may also be potassium iodide, potassium chloride, sodium chloride, benzotriazo-6-nitro-benzimidazole, or the like.

In addition to the above, it is also possible to introduce into the developer liquid such optional components as: polyethylene oxide or β-phenylethylamine for accelerating the developing speed to increase the sensitivity; sodium hexametaphosphate or EDTA for water softening; sodium sulfate for preventing swelling of the polymeric article at an elevated temperature; or an anti-freezing agent.

In the wet development step, silver nuclei 10 are reduced by the developing agent in the developer liquid into elemental or metallic silver 11. It is possible to allow the un-reduced part of the photosensitive silver halide remaining in the silver salt-containing polymeric article 9, but the remaining photosensitive silver halide may be removed as desired to effect so-called fixation for stabilizing the silver image. The fixation may be performed by dipping the polymeric article within a fixing liquid after dipping within the developer liquid. The fixing liquid may contain a component for dissolving the photosensitive silver halide, which component may preferably be sodium thiosulfate or ammonium thiosulfate.

Further, it is also possible to use a single developing-fixing liquid obtained by adding a fixing liquid component into the developer liquid.

In the wet developing step, while the developing agent in the developer liquid reduces the photosensitive silver halide, the developing agent is reversely converted into the oxidation product. A radical formation during the reaction for causing the polymerization of the polymerizable compound has been reported in JP-A 58-121031 so that a separate polymerization exposure step can be omitted depending on some circumstances. However, in order to sufficiently introduce a part of the surface reforming medium into the polymeric article, the polymerization exposure step may be separately performed after the wet development step.

Next, the process for producing a printing plate utilizing the surface reforming method according to the present, invention, and the printing process using the plate will be described.

According to the process for producing a printing plate according to the present invention, a polymeric article or silver salt-containing polymeric article (hereinafter collectively called a "plate-forming polymeric article") is provided with a difference in wettability with an ink or water in a prescribed pattern by utilizing the surface reforming method according to the present invention. In the printing process according to the present invention, an ink placed on the printing plate thus produce is transferred onto a recording medium, such as paper.

The process for producing a printing plate according to the present invention is similar to the above-described surface reforming method according to the present invention except that the surface reforming medium is composed from a material having a specific function. More specifically, the surface reforming medium used in the process for producing a printing plate according to the present invention may comprise a material having a function of imparting the plate-forming polymeric article with an enhanced wettability to water or an enhanced water-repelling property. Thus, the printing plate produced by the process of the present invention is formed by forming on the surface of the plate-forming polymeric article a pattern with a different wettability to water so as to allow the attachment of dampening water, an oily ink or a hydrophilic ink in a pattern.

In the case where the plate-forming polymeric article is imparted with a decreased wettability with water, the surface reforming medium may preferably comprise a lipophilic or water-repellent material as described.

On the other hand, in the case where the plate-forming polymeric article is provided with an enhanced wettability with water, the surface reforming medium may preferably comprise a hydrophilic or water-retentive material as described before.

In this way, the plate-forming polymeric article is provided with a pattern of different wettability with water to be usable as a printing plate. If the cycle including the contact step, the polymerization step and the separation step is repeated by using two or more types of surface reforming media, it is possible to increase the contrast of wettability. For example, a surface reforming medium comprising a lipophilic or water-repellent material and a surface reforming medium having a hydrophilic or water-retentive property are used so that the surface reforming medium comprising a lipophilic or water-repellent material is used in a first cycle and then the surface reforming medium comprising a hydrophilic or water-retentive material is used in a second cycle with respect to different parts, more particularly complementary parts, of the surface of the plate-forming polymeric article. Alternatively, the surface reforming medium comprising a hydrophilic or water-retentive material may be used in a first cycle and the surface reforming medium comprising a lipophilic or water-repellent material may be used in a second cycle. By repeating the cycle including the contact step, the polymerization step and the separation step in the above described manner, the plate-forming polymeric article is provided with an increased wettability and a decreased wettability compared with the wettability of the plate-forming polymeric article per se or the polymerized product thereof, thereby to provide a printing plate having an excellent contrast of wettability with water.

It is also possible to provide an enhanced contrast of water-wettability by using a surface reforming medium and a functional powder in combination. More specifically, a surface reforming medium comprising a water-repellent material is first used to provide a polymeric article with a pattern of water-repellent polymerized part, and then hydrophilic powder is attached to the remaining unpolymerized part of the polymeric article to form a printing plate having an enhanced contrast of water-wettability. Alternatively, water-repellent powder may be used in the case where a hydrophilic surface reforming medium is used.

The attachment of functional powder is not restricted to a particular way but may be performed in various ways, inclusive of: dropping of powder, e.g., under gravity for attachment; passing of a plate-forming polymeric article through a mass of powder; forcive movement of a powder layer for attachment; blasting of powder for attachment; and attachment of powder under an electrostatic attractive force after charging either one or both of powder and a plate-forming polymeric article (application of the powder may be performed by powder spraying method; cascading method, magnetic brush method, powder cloud method, open chamber method, fur brush method and print-developing method).

In this instance, in order to increase the viscous adhesiveness of the un-polymerized part, it is possible to heat the plate-forming polymeric article to a temperature T in the range of $T_1 > T > T_2$, wherein $T_1$ is a minimum temperature at which the polymerized part shows an adhesiveness and $T_2$ is a minimum temperature at which the un-polymerized part shows an adhesiveness. The temperature T may preferably be 30° C.–200° C., further preferably be 40° C.–130° C.

Referring to FIG. 12, when such functional powder 31 is dispersed onto a partly polymerized plate-forming polymeric article 30, the powder is first placed on the entire surface of the plate-forming polymeric article 30, but powder 31 on the un-polymerized parts is attached thereto by the adhesiveness of the un-polymerized parts, while powder on the polymerized parts are just placed thereon, so that the powder 31 on the polymerized parts can be selectively removed by a simple method such as suction, blowing with air, swaying of the plate-forming polymeric article 30, use of an adhesive material showing a weaker adhesiveness than the un-polymerized part, to leave the polymeric article 30 provided with the powder 31 selectively attached to the un-polymerized parts as shown in FIG. 12.

In this instance, it is very effective to embed the powder 31 at the un-polymerized parts for firmer attachment as by passing through rollers or pressure application with a press of the plate-forming polymeric article loading the powder 31, prior to the selective removal of the powder.

The polymeric article 30 treated up to this stage can be used as a printing plate as it is, but a part of the powder thus attached is liable to be peeled off to result in a decrease in printing image quality, so that it is preferred to fix the powder by the following step. Thus, the unpolymerized parts to which the powder is attached is further polymerized to fix the powder thereat, and then an excessive amount of the powder removal to provide a lithographic printing plate.

Such functional powder used in the present invention may be hydrophilic (water-retentive) or hydrophobic (water-repellent) as described above.

The hydrophilic powder may comprise powder of hydrophilic materials inclusive of: metals, such as aluminum, copper, chromium, nickel, lead, iron, and zinc; oxides of magnesium, aluminum, beryllium, zinc, tin, copper, iron, etc.; natural minerals, such as kaolin clay, agalmatolite clay, dickite clay, halloysite clay, talc, sericite, mica, bentonite, smectite, montomorillonite, pumice, slate, asbestos, wolframite, diatomaceous earth, silica sand, and silica stone; fillers and pigments, such as carbon black, silica, titanium oxide, satin white and silica-alumina zeolite; plant polymers, such as guar gum, locust bean gum, gum arabic, tragacanth, carrageenan, pectin, mannan, and starch; microorganism polymers, such as xanthane gum, dextrin, succinoglucan, and curdran; animal polymers, such as gelatin, casein, albumin, and collagen; cellulose polymers such as methyl cellulose, ethyl cellulose, and hydroxyethyl cellulose; starch polymers, such as soluble starch, carboxymethyl starch, and methyl starch; alginic acid polymers, such as propylene glycol alginate, and alginic acid salts; other semisynthetic polymers, such as derivatives of polysaccharides; vinyl polymers, such as polyvinyl alcohol, polyvinylpyrrolidone, polyvinyl methyl ether, carboxyvinyl polymer, sodium polyacrylate, and polyacrylamide; and other synthetic polymers, such as polyethylene glycol, ethylene oxide-propylene oxide block copolymer. These powders may be used singly or in combination of two or more species.

The above-mentioned hydrophilic powders not only provide a wettability to an aqueous medium, such as dampening water because of its hydrophilicity, but also provide a minute uneven surface like that of a grained PS (presensitized) plate showing a water-retentive property.

The hydrophobic or water-repellent powder may comprise powder of hydrophobic materials, inclusive of: fluorine-containing resin, such as polytetrafluoroethylene, tetrafluoroethylene-perfluoroalkyl vinyl ether copolymer, tetrafluoroethylene-hexafluoropropylene copolymer, tetrafluoroethylene-hexafluoropropylene-perfluoroalkyl vinyl ether copolymer, tetrafluoroethylene-ethylene copolymer, polychlorotrifluoroethylene, chlorotrifluoroethylene-ethylene copolymer, polyvinylidene fluoride, polyvinyl fluoride, and poly(carbon-monofluoride); silicone resins; hydrophobicity-imparted silica (e.g., one known by the trade name of "Aerosil R 972", mfd. by Nihon Aerosil K. K.); vinyl resins such as polystyrene, polyvinyl chloride, polyvinyl acetate, polyvinyl butyral, polyvinyl acetal, polyvinyl alcohol, and polyvinyl pyrrolidone; copolymer resins such as a styrene/butadiene copolymer, a styrene-acrylonitrile copolymer, a styrene-butadiene-acrylonitrile copolymer, and a vinyl chloride-vinyl acetate copolymer; acrylic resins such as polymethyl methacrylate, polymethyl acrylate, polybutyl acrylate, and styrene-methyl methacrylate copolymer; polyesters such as polyethylene terephthalate; polyolefins such as polyethylene, polypropylene, and chlorinated polyethylene; polyamides; polyimides; epoxy resins; phenolic resins; polyarylate resins; and nylon. Among these, powder of fluorine-containing resins are particularly preferred. Any of the above powders may be used singly or in combination of two or more species.

The above-enumerated water-repellent (hydrophobic) or hydrophilic powder may preferably have an average particle size of at most 100 microns, further preferably 50–0.001 micron, particularly 1–0.05 micron, in respects of resultant image quality and handling of the powder at the time of production. The average particle size of powder described herein are based on values measured by using a super centrifuge-type automatic particle size distribution measurement apparatus (model "CAPA-700", available from Horiba Seisakusho K. K.).

The powder used in the present invention is placed into contact with dampening water at the time of printing, so that it should preferably be hardly water-soluble, particularly even at an elevated temperature (70° C. or below) realized during the printing. Herein, the term "hardly water-soluble" refers to such a solubility in water that a longer time is required for complete dissolution of the powder than the printing service time so that the resultant printed image quality is not affected by the water-solubility.

The shape of the printing plate may be that of a flat plate, a cylinder, a roll, or the like, and need not be restricted in a particular way. However, in order to be wound about a cylinder for a printer, the printing plate may be generally in the form of a flat plate.

The printing plate prepared by the present invention may preferably have a part showing a contact angle of at least 70 degrees and a part showing a contact angle of at most 20 degrees, respectively with respect to water. Further, in order to provide a larger contrast (difference in wettability), the printing plate may further preferably have a part showing a contact angle of at least 100 degrees and a part showing a contact angle of at most 10 degrees. This level of contrast can be provided according to the present invention by appropriate selection of the surface reforming medium and the powder. It is difficult to provide such a large contrast by a conventional photosensitive plate or by a printing plate obtained by only surface reforming. In other words, the printing plate capable of having a very large contrast can provide high quality printed images which are free from white dropout or fog and excellent in sharpness.

By using a lithographic printing plate thus prepared, lithographic printing can be performed by using dampening water and an oily ink, or a hydrophilic or aqueous ink. The printing apparatus used for this purpose may be a lithographic printer, suitably a small-scale one such a desktop-type or a floor-standing type offset printer, but is not necessarily restricted to the above.

Hereinbelow, an embodiment of a printing apparatus using a printing plate as prepared by the process of the present invention will be described with reference to FIG. 13.

In a printing apparatus as shown in FIG. 13, a printing plate 14 according to the present invention may be fixed about a plate cylinder 23 by means of, e.g., a chuck as used in an ordinary offset printer.

The printing plate 14 is supplied with an ink 25 in an ink fountain 27 through an ink supply means, which comprises a plurality of ink supply rollers 20.

In case where the plate 14 is provided with a pattern of water-wettability, an oily ink is used as the ink 25 and, prior to the supply of the ink 25 to the plate 14, dampening water 26 in a dampening water reservoir 27 is supplied to the plate 14 through a plurality of rollers 19 along with the rotation of the cylinder 23 in the direction of an arrow A. Then, the ink 25 is supplied.

As a result, at an easily wettable part of the plate 14, the dampening water 25 is retained and the ink 25 is repelled. On the other hand, at a hardly wettable part of the plate 14, the dampening water is repelled, and the ink 25 is attached. Thus, the ink 25 is attached onto the plate in a pattern corresponding to the difference in wettability.

In contact with the plate 14, a blanket cylinder 15 is disposed so as to rotate in a reverse direction with respect to the plate cylinder 23. An impression cylinder 18 as a transfer means is further disposed in contact with the blanket cylinder 15 so as to rotate in a reverse direction with respect to the blanket cylinder. As a result, the ink 25 on the plate 14 is first transferred onto the blanket cylinder 15 and then transferred to a recording medium 17 passing between the blanket cylinder 15 and the impression cylinder 18 to complete the printing.

The recording medium composed of, e.g., a paper or plastic sheet is stored in a cassette 21 and sent out sheet by sheet by means of a roller 16, and the recording sheet after the printing is discharged to a tray 22.

The number of the ink supply rollers 20 is not particularly limited but may be generally about 4–20 depending on the distribution and thickness of the ink. Likewise, the number of the dampening water supply rollers 19 is not particularly limited but may generally be about 2–10.

In some cases, the blanket cylinder 15 can be omitted so that the ink on the plate 14 is directly transferred to the recording medium 17. In view of the durability of the plate 14 and the printing performance on rough paper (paper with a poor smoothness), a so-called offset printing using a blanket cylinder is preferred.

In the embodiment shown in FIG. 13, an ink supply means and a dampening water supply means are separately provided. However, it is also possible to supply the dampening water onto the ink supply rollers 20 so that the ink and the dampening water are simultaneously supplied to the plate 14. This arrangement is an advantage for compactization of the apparatus to provide a desktop offset printer.

A rotary printing apparatus has been described above, but the printing plate according to the present invention is also applicable to another-type, such as a flat-bed printing apparatus in which a plate-mounting part (corresponding to the plate cylinder 23 in the embodiment of FIG. 13) is in the form of a flat bed.

In the case of printing utilizing a printing plate based on a wettability difference, it is preferred to impart dampening water or an ordinary etch liquid to the easily wettable part of the plate so as to convert the plate into a water-retentive state like the desensitization in the conventional lithography, and then fix the plate about the plate cylinder for printing. However, it is also possible to first fix the plate about the plate cylinder and then convert the plate into a water-retentive state, followed by printing.

In the embodiment shown in FIG. 13, an oily or lipophilic ink is used, but it is also possible to use an aqueous or hydrophilic ink. In this case, the aqueous or hydrophilic ink is attached selectively to the easily wettable part of the plate and used for printing.

In the printing process according to the present invention, both an oily ink and an aqueous ink may be used.

Herein, the oily or lipophilic ink is an ink composed of such components as dye or pigment, an oil, a resin, a solvent and a plasticizer. The oil may for example be plant oil, prepared oil and mineral oil. the resin may include: natural resin, such as rosin and shellac; and synthetic resins, such as phenol-type resins and ketone-type resins. The solvent may preferably be one which shows an appropriate solving and diluting power with respect to the resin constituting the ink and a desired vaporization speed, and provides the whole ink with necessary viscosity and fluidity. Examples of such inks may include: aliphatic hydrocarbons, such as n-hexane; alicyclic hydrocarbons, such as cyclohexane; aromatic hydrocarbons, such as toluene; esters, such as methyl acetate and ethyl acetate; alcohols, such as methyl alcohol and ethyl alcohol; ketones, such as acetone and methyl ethyl ketone; glycols, such as ethylene glycol, propylene glycol, and dipropylene glycol; glycol ethers; and glycol ether esters. These solvents can be used in mixture depending on the desired properties. The plasticizer may be used so as to provide the dried film of the ink with flexibility, softness and cold resistance, and examples thereof may include: phthalic esters, such as dibutyl phthalate and dioctyl phthalate, esters, such as those of adipic acid and citric acid; chlorinated paraffin, castor oil, epoxy-type plasticizers, and polyester-type plasticizers.

The dyes or pigments, may include inorganic or organic pigments, such as titanium oxide, carbon black, bronze powder, diazo yellow, and phthalocyanine blue. In addition to the dyes or pigments, it is also possible to use powdery coloring developer, such as powder of a binder polymer such as polystyrene in which dyes or pigments or metal powder is dispersed. The above dyes or pigments or powdery coloring developer may desirably have an average particle size of 0.1–20 microns, preferably 1–5 microns.

Further, it is possible to use an aqueous ink for printing instead of dampening water/oily ink. Such aqueous or hydrophilic ink may generally comprise a desired dye or pigment as described above, a water-soluble polymer, such as polyvinyl alcohol, polyvinylpyrrolidone or polyacrylamide, an auxiliary agent, such as a surfactant, and water as a solvent.

Further, in consideration of compatibility between the ink described above and the printing plate, it is also possible to incorporate appropriate additives, as desired, such as a photocoloration-prevention agent, a solid solvent, a surfactant, and an anti-static agent.

It is preferred that the printing plate according to the present invention is free from any remaining un-polymerized part. An improved durability is obtained when the entire surface of the printing plate has been polymerized. For this reason, if there remains any un-polymerized part after the surface reforming, the entire printing plate may preferably be imparted with light or heat to be polymerized entirely.

As described above, according to the surface reforming method of the present invention, it is possible to effect surface reforming very simply and quickly and without using a vacuum system. The surface reforming method of the present invention provides a large surface reforming effect to give a reformed surface property which is retained for a long period, and the surface reforming can be performed locally selectively. Further, a single polymeric article can be provided with various surface properties by performing a locally selective surface reforming by using a first surface reforming medium and then by performing a locally selective surface reforming again by using a second surface reforming medium comprising a different material.

By applying the surface reforming method of the present invention, a polymeric article can be easily provided with improved adhesiveness, printing performance or printability and coating characteristic.

Further, the surface reforming can be performed at higher sensitivity and higher resolution by using a silver salt-containing polymeric article.

Further, when a single polymeric article is provided with an image pattern with a difference in wettability by applying the surface reforming method according to the invention, a product usable as a printing plate can be obtained. By using a surface reforming medium and a functional powder appropriately selected in combination in the production process of the invention, the product printing plate can be provided with a very large contrast and thus provide very high-quality prints free from defects such as fog or white dropout.

Hereinbelow, the present invention will be explained more specifically based on Examples and Comparative Examples. In the description below, "wt. parts" are simply described as "parts".

In the description below "ESCA (surface) analysis" means an analysis performed by using an X-ray photoelectron analyzer ("ESCA 750", available from Shimazu Seisakusho K. K.) and Mg-Kα ray at a scanning speed of 0.1 eV/sec.

Further, the contact angle measurement was performed by using a contact angle meter (Model "CAS-150", available from Kyowa Kaimen Kagaku K. K.) and by placing a water droplet with a diameter of about 1.5 mm on a polymeric article to measure the contact angle at a time of 10 seconds after the instant of the placement.

Further, in the following Examples and Comparative examples, the preparation of a silver salt-containing polymeric article was performed in a dark room, and the preparation of a polymeric article containing no photosensitive silver salt component was performed under a safe light.

EXAMPLE 1

| | |
|---|---|
| Polyvinyl butyral resin ("Eslec BX-1" (trade name) mfd. by Sekisui Kagaku Kogyo K.K.) | 1 part(s) |
| Dipentaerythritol hexaacrylate ("Kayarad DPHA" (trade name), mfd. by Nihon Kayaku K.K.) | 1 part(s) |
| 2,4-Diethylthioxanthone ("Kayacure DETX" (trade name), mfd. by Nihon Kayaku K.K.) | 0.2 part(s) |
| Ethyl 4-dimethylaminobenzoate ("Kayacure EPA" (trade name), mfd. by Nihon Kayaku K.K.) | 0.2 part(s) |
| Methyl ethyl ketone | 13 part(s) |

A liquid having the above composition was prepared and applied onto a 50 micron-thick polyester film by an applicator and dried to form a 5–6 micron-thick polymeric article on the polyester film (Hereinafter a polymeric article in the form of a layer formed on a support is called a "polymeric layer", and the term "polymeric article" is used to rather mean a laminate structure including the polymeric layer and the support).

Then, a 50 micron-thick polytetrafluoroethylene film ("Teflon Tape TOMBO 9001", Nichiasu K. K.) was provided as a surface reforming medium and laminated onto the above polymeric layer at a nip pressure of 0.2 kg/cm$^2$ and temperature of 80° C. by means of a laminator. Then, the polymeric layer was exposed through the polyester film for 10 sec. to fluorescent light having a peak wavelength at 380 nm from a fluorescent lamp disposed about 3 cm apart. At this time, the polymeric layer was simultaneously heated at 92° C. as a thermal bias.

After the above polymerization step, the polytetrafluoroethylene film was peeled off the polymeric layer. Then, the polymeric layer was subjected to the ESCA surface analysis whereby a fluorine peak not found in the original polymeric layer was clearly observed and a surface reforming of the polymeric layer was confirmed.

EXAMPLE 2

A surface reforming operation was performed similarly as in Example 1 except that the exposure in the polymerization step was performed after superposing a negative mask having a light-transmissive part and a non-transmissive part.

Figure 14:
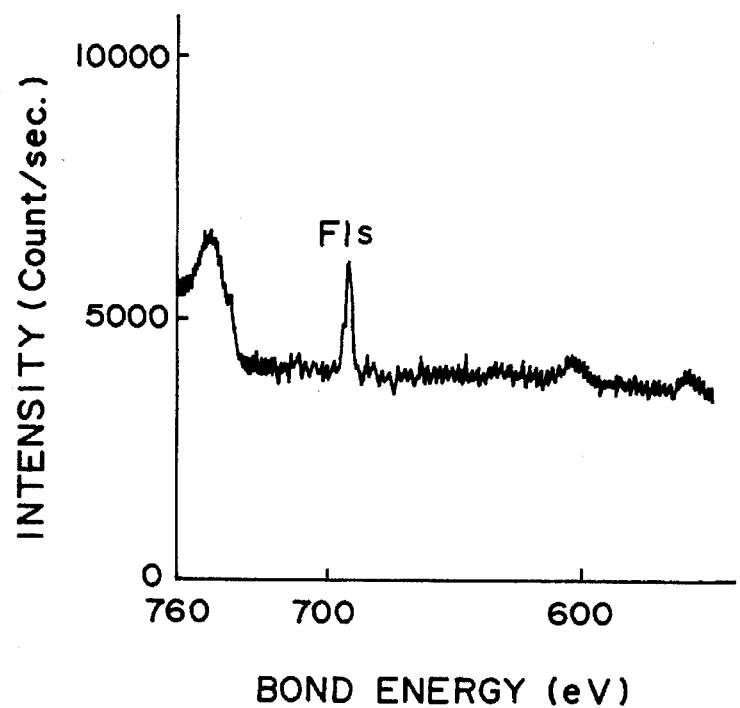
FIGS. 14 and 15 are graphs showing results of surface analysis of a polymeric article in Example 2 appearing hereinafter.
Figure 15:
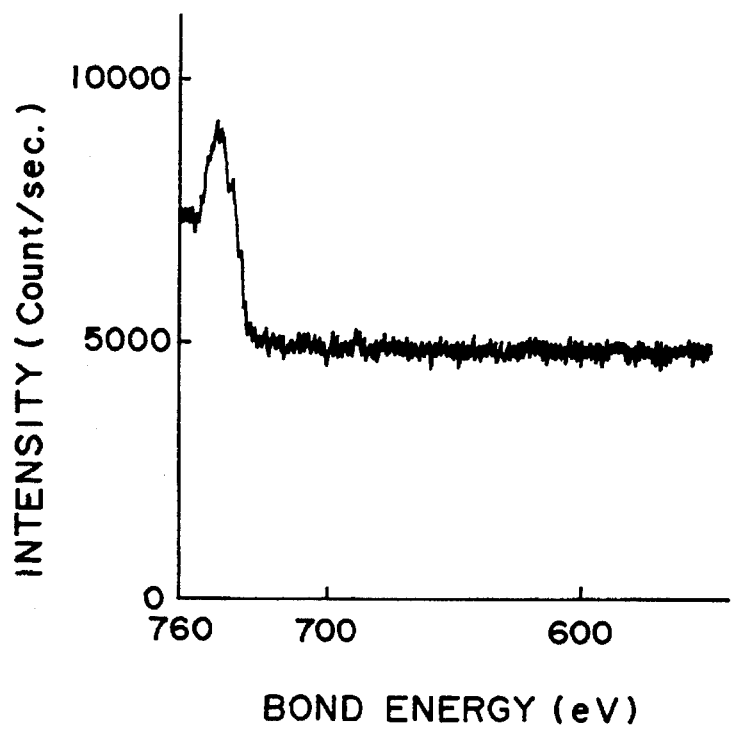

As a result of the ESCA analysis of the polymeric layer, the presence of fluorine was confirmed at the polymerized part (FIG. 14) but not observed at the un-polymerized part (FIG. 15).

Then, the polymeric layer provided with the above pattern was further laminated with a polyester film at 80° C. and then subject to the whole-area exposure under the same irradiation condition as the previous exposure through a mask to complete the polymerization of the polymeric layer. As a result of the ESCA analysis, the polymeric layer showed the presence of fluorine at the first polymerized part formed at the time of exposure through the mask but did not show the presence of fluorine at the later polymerized part in lamination with the polyester film.

As a result of the contact angle measurement with respect to water, the polymeric layer showed a contact angle of 105 degrees at the first polymerized part and 55 degrees at the later polymerized part.

EXAMPLE 3

Two laminates each having the polymeric layer and the surface reforming medium (polytetrafluoroethylene film) in Example 1 were provided. The two laminates were respectively exposed in the same manner as in Example 1 except that one laminate was supplied with a thermal bias at 65° C. and the other laminate was supplied with a thermal bias at 92° C. similarly as in Example 1. Then, each polytetrafluoroethylene film was peeled off the two laminates.

The resultant polymeric layers were analyzed similarly as in Example 1, whereby the polymeric layer polymerized under a thermal bias at 65° C. showed a smaller fluorine peak and a contact angle of 75 degrees, while the polymeric layer polymerized under a thermal bias at 92° C. showed a larger fluorine peak and a contact angle of 98 degrees. Thus, the degree of surface reforming could be changed by changing the thermal bias temperature.

EXAMPLE 4

A polymeric layer was subjected to surface reforming in the same manner as in Example 1 except that the exposure in the polymerization step was effected through a gradation mask having light-transmissive parts with different transmissivities of 1:1/2:1/4.

As a result of the ESCA analysis of the polymeric layer, the polymeric layer provided fluorine peaks with decreasing intensities along with the decreases in transmissivity of the mask, whereby a gradational surface reforming was performed.

EXAMPLE 5

The polymeric layer in Example 1 was laminated with a 9 micron-thick vinylidene chloride resin film (available from Asahi Kasei K. K.) as a surface reforming medium at 50° C. and then exposed in the same manner as in Example 1 except that the exposure was performed for 5 sec through a negative mask having a light-transmissive part and a non-transmissive part at a thermal bias temperature of 50° C. Then, the vinylidene chloride resin film was peeled off.

As a result of the ESCA analysis, the polymeric layer showed a peak of chlorine (FIG. 16) which was not observed in the original polymeric layer at the polymerized part but did not show any chlorine peak at the non-polymerized part (FIG. 17).

EXAMPLE 6

| | |
|---|---|
| Polyvinyl butyral resin ("Eslec BL-2" (trade name) mfd. by Sekisui Kagaku Kogyo K.K.) | 1 part(s) |
| Trimethylolpropane triacrylate ("Aronix M-309" (trade name), mfd. by Toa Gosei Kagaku K.K.) | 1 part(s) |
| 2,4-Diethylthioxanthone ("Kayacure DETX" (trade name), mfd. by Nihon Kayaku K.K.) | 0.1 part(s) |
| Ethyl 4-dimethylaminobenzoate ("Kayacure EPA" (trade name), mfd. by Nihon Kayaku K.K.) | 0.1 part(s) |
| n-Butanol | 13 part(s) |

A liquid having the above composition was prepared and a polymeric article was prepared by using the liquid otherwise in the same manner as in Example 1.

Then, a 10%-aqueous solution of polyvinyl alcohol ("Gosenol NH-18" (trade name), mfd. by Nihon Gosei Kagaku Kogyo K. K.) was applied by means of an applicator onto a 16 micron-thick polyester film and dried to form a surface reforming medium having a 2 micron-thick polyvinyl alcohol layer.

Then, the above-prepared polymeric article and the surface reforming medium were superposed with each other so that the polymeric layer and the polyvinyl alcohol layer contacted each other, and the superposed structure was passed through hot rollers at 50° C. to form a laminate.

Then, the polymeric layer was exposed in the same manner as in Example 1, and the surface reforming medium was peeled off to leave a surface-reformed polymeric layer (A).

For comparison with the polymeric layer (A), a polymeric layer (B) was obtained by forming a polymeric article in the same manner as above and subjecting the polymeric layer to exposure without laminating the above surface reforming medium otherwise in the same manner as above.

The polymeric layers (A) and (B) were subjected to IR (infrared) analysis, whereby the polymeric layer (A) showed the presence of a much larger amount of hydroxy group and surface reforming with polyvinyl alcohol.

As a result of the contact angle measurement with respect to water, the polymeric layer (A) showed 32 degrees and the polymeric layer (B) showed 78 degrees.

Further, a 1000 A-thick Al film was formed by vapor deposition on each of the polymeric layers (A) and (B) and, after 1 day of standing, subjected to a 100 checker pattern tape-peeling test according to JIS K5400, whereby the polymeric layer (A) showed a remaining checker ratio of 100/100 and the polymeric layer (B) showed a ratio of 20/100, thus the polymeric layer (A) showing a higher adhesiveness to the Al-deposited film.

EXAMPLE 7

| | |
|---|---|
| Acrylic resin ("Dianal BR-90", Mitsubishi Rayon K.K.) | 1 part(s) |
| Caprolactone-modified dipentaerythritol hexaacrylate ("Kayarad DPCA-60", Nihon Kayaku K.K.) | 1 part(s) |
| Benzophenone ("Kayacure-BP", Nihon Kayaku K.K.) | 0.05 part(s) |
| Methyl ethyl ketone | 13 part(s) |

A polymeric article was prepared in the same manner as in Example 1 except for using the above liquid composition.

Then, a 10%-thermal solution of hydroxypropylcellulose ("HPC-SL", Nihon Soda K. K.) was applied onto a 16 micron-thick polyester film otherwise in the same manner as in Example 6 to form a surface reforming medium.

Then, the polymeric article and the surface reforming medium were laminated with each other in the same manner as in Example 6. The polymeric layer was then subjected to exposure for 5 sec through a negative mask having a light-transmissive part and a non-transmissive part from a high-voltage mercury lamp (Model "BS-7" (trade name), mfd. by Mikasa K. K.) disposed so as to provide an irradiation intensity at the surface of 5 mW/cm$^2$ with application of a thermal bias at 54° C. Then, the surface reforming medium was peeled off to obtain a surface-reformed polymeric layer.

As a result of the surface IR analysis, the polymeric layer showed a clearly increased hydroxyl group content at the polymerized part.

Further, the polymerized part showed a contact angle of 34 degrees and the un-polymerized part showed a contact angle of 70 degrees.

EXAMPLE 8

The liquid composition used in Example 6 was applied by an applicator onto a 100 micron-thick polycarbonate film to form a lithographic plate blank having a 5–6 micron-thick polymeric layer.

The plate blank was laminated with a similar surface reforming medium having a polyvinyl alcohol layer and exposed (with application of thermal bias), followed by peeling of the surface reforming medium and 60 sec of whole-area exposure to polymerize the entire area of the polymeric layer, thus providing a lithographic plate.

Then, the plate showed a contact angle with respect to water of 32 degrees at the polymerized part formed during the exposure through the mask and 78 degrees at the later polymerized part at the time of the whole-area exposure.

The thus obtained lithographic plate was fixed about the plate cylinder of a desktop-type offset printer ("San-Offset" (trade name), mfd. by San Insatsu Kikai K. K.), and printing was performed on coated paper by using an oily ink ("New Champion AT 185 Black", mfd. by Dai Nippon Ink K. K.) and dampening water (6-times dilution of an etch liquid available from Gestetner Ltd.), whereby black images identical to the mask pattern were obtained.

EXAMPLE 9

Example 8 was repeated up to the polymerization step and the separation step, and the plate blank at this stage was further laminated with a surface reforming medium of polytetrafluoroethylene identical to the one used in Example 1, followed by whole-area exposure (with application of a thermal bias) of the laminate, peeling-off of the surface reforming medium and whole-area exposure for 60 sec of the plate blank, to obtain a lithographic plate.

The lithographic plate showed a contact angle with water of 32 degrees at the polymerized part with the use of polyvinyl alcohol surface reforming medium and 105 degrees at the later polymerized part with the use of the polytetrafluoroethylene surface reforming medium.

The thus prepared plate was used in lithographic printing in the same manner as in Example 8, whereby better application of the ink (better repelling of water) was accomplished to provide black images free from white dropout.

EXAMPLE 10

A lithographic plate blank was prepared in the same manner as in Example 8.

Then, a surface reforming medium was prepared applying onto a polyester film the following liquid composition by means of a wire bar so as to provide a dry thickness of 5–6 microns.

| | |
|---|---|
| Acrylonitrile-polyoxyalkylene copolymer | 5 part(s) |
| Water-dispersible acrylic resin ("Acryset EX-14", Nihon Shokubai Kagaku K.K.) | 40 part(s) |
| Surfactant ("Emulgen 909", Kao K.K.) | 10 part(s) |
| Butyl cellosolve | 10 part(s) |
| Deionized water | 35 part(s) |

The, the plate blank and the surface reforming medium were laminated and exposed (with application of a thermal bias), followed by peeling of the surface reforming medium. Then, the plate blank was further laminated with a polytetrafluoroethylene surface reforming medium and exposed (with application of a thermal bias), followed by peeling to form a lithographic plate.

The lithographic plate showed a contact angle with water of 20 degrees at the polymerized part in contact with the acrylonitrile-polyoxyalkylene copolymer surface reforming medium and 105 degrees at the polymerized part in contact with the polytetrafluoroethylene surface reforming medium.

Referring to FIG. 13, the plate 14 thus prepared was fixed about a plate cylinder 23, the ink used 24 in Example 8 and dampening water (deionized water) 26 were placed in an ink fountain 25 and an ink reservoir 27, respectively, and an apparatus as shown was brought into operation. As a result, the dampening water was first supplied to the plate 14 through dampening water supply rollers 19 and then the ink 24 was supplied to the plate through ink supply rollers 20. Then, when the plate 14 (on the plate cylinder 23) was caused to contact a blanket cylinder 15, the ink was transferred and attached to the blanket cylinder and then transferred to plain paper 17 which was supplied from a cassette 21 through a roller 16, when the paper passed between the blanket roller 15 and an impression roller 18, whereby prints were obtained.

By the above printing, prints with black images free from scumming similarly as in Example 9 were obtained at a printing speed of 120 sheets/min.

EXAMPLE 11

| | |
|---|---|
| Silver bromide | 0.7 part(s) |
| Silver behenate | 4.5 part(s) |
| Behenic acid | 2.5 part(s) |
| Phthalazinone | 1.0 part(s) |
| 4,4'-Methylenebis(2-methyl-1-naphthol) | 3.2 part(s) |
| Polyvinyl butyral resin ("Eslec BL-2", Sekisui Kagaku K.K.) | 5.0 part(s) |
| Dipentaerythritol hexaacrylate ("Kayarad DPHA", Nihon Kayaku K.K.) | 10 part(s) |
| 3,3'-Carbonylbis(7-diethylamino-coumarin) | 0.3 part(s) |
| Ethyl 4-dimethylaminobenzoate ("Kayacure EPA", Nihon Kayaku) | 0.2 part(s) |
| Xylene/n-butanol (7/3) | 150 part(s) |

The above ingredients respectively weighed were sufficiently dissolved and mixed with each other by means of a paint shaker, and the resultant liquid was applied by an applicator onto a 50 micron-thick polyester film so as to provide a dry thickness of 50 microns, thereby to obtain a silver salt-containing polymeric article.

Then, a 10%-aqueous solution of polyvinyl alcohol ("Gosenol NH-18" (trade name), mfd. by Nihon Gosei Kagaku Kogyo K. K.) was applied by means of an applicator onto a 9 micron-thick polyester film and dried to form a surface reforming medium having a 2 micron-thick polyvinyl alcohol layer.

Then, the above-prepared silver salt-containing polymeric article and the surface reforming medium were superposed with each other so that the polymeric layer and the polyvinyl alcohol layer contacted each other, and the superposed structure was passed through hot rollers at 50° C. to form a laminate.

Then, on the surface reforming medium in the thus-prepared laminate of the silver salt-containing polymeric article/surface reforming medium, a negative mask having a light-transmissive part and a non-transmissive part was placed in alignment, and imagewise exposure was performed for 0.5 sec from a tungsten lamp 5 cm spaced apart. then, the negative mask was removed, and the laminate was passed through a thermal developing apparatus at 120° C. in 20 sec. Then, the laminate was placed on a hot plate heated at 65° C., and exposed for 10 sec to fluorescent light having a peak at 420 nm from a fluorescent lamp 3 cm space apart, thereby to form a polymerization image in the silver salt-containing polymeric layer.

Then, the surface reforming medium was peeled off, and the polymeric layer on the hot plate was further subject to 60 seconds of whole area exposure by using the same fluorescent lamp disposed 3 cm apart, thereby to polymerize the un-polymerized part of the silver salt-containing polymeric layer. Thus, a printing plate according to the present invention was obtained.

The thus-prepared lithographic plate showed a contact angle with water of 32 degrees at the part polymerized in contact with the surface reforming medium and 92 degrees at the part polymerized after separation of the surface reforming medium.

The lithographic plate was then fixed about the plate cylinder of a desktop-type offset printer ("San-Offset" (trade name), mfd. by San Insatsu Kikai K. K.), and printing was performed on coated paper by using an oily ink ("New Champion AT 185 Black", mfd. by Dai Nippon Ink K. K.) and dampening water (6-times dilution of an etch liquid available from Gestetner Ltd.), whereby black images identical to the mask pattern were obtained.

EXAMPLE 12

A printing plate according to the present invention was prepared in the same manner as in Example 11 except that the surface reforming medium having a polyvinyl alcohol layer was replaced by a surface reforming medium prepared by coating a 9 micron-thick polyester film with a 10%-ethanol solution of hydroxycellulose ("HPC-SL", mfd. by Nihon Soda K. K.) by an applicator form a 2 micron-thick dry coating layer.

The resultant lithographic plate showed contact angles of 32 degrees and 92 degrees at parts polymerized in the presence and in the absence, respectively, of the surface reforming medium.

Then, the lithographic plate was used for printing in the same manner as in Example 11 whereby black images were obtained similarly as in Example 11.

EXAMPLE 13

A printing plate according to the present invention was prepared in the same manner as in Example 11 except that the surface reforming medium having a polyvinyl alcohol layer was replaced by a surface reforming medium prepared by coating a 9 micron-thick polyester film with a liquid having the following composition by an applicator to form a 2 micron-thick dry coating layer.

| | |
|---|---|
| Acrylonitrile-polyoxyalkylene copolymer | 5 part(s) |
| Water-dispersible acrylic resin ("Acryset EX-14", Nihon Shokubai Kagaku K.K.) | 40 part(s) |
| Surfactant ("Emulgen 909", Kao K.K.) | 10 part(s) |
| Butyl cellosolve | 10 part(s) |
| Deionized water | 35 part(s) |

The resultant lithographic plate showed contact angles of 16 degrees and 92 degrees at parts polymerized in the presence and in the absence, respectively, of the surface reforming medium.

Then, the lithographic plate was used for printing in the same manner as in Example 11 whereby black images with less fog at the non-image part were obtained as in Example 11. The printing speed was 120 sheets/min.

EXAMPLE 14

| | |
|---|---|
| Silver bromide | 1.1 part(s) |
| Silver behenate | 6.8 part(s) |
| Behenic acid | 3.8 part(s) |
| Phthalazinone | 1.5 part(s) |
| 4,4'-Methylenebis(2,6-di-tert-butylphenol) | 4.8 part(s) |
| Synthetic silica ("Mizukasil p-526", Mizusawa Kagaku K.K.) | 7.5 part(s) |
| Water-dispersible acrylic resin ("Acryset EX-14", Nihon Shokubai Kagaku K.K.) | 40 part(s) |
| Surfactant ("Emulgen 909", Kao K.K.) | 10 part(s) |
| Butyl cellosolve | 40 part(s) |
| Deionized water | 140 part(s) |
| Epoxy acrylate ("Kayarad R-167", Nihol Kayaku K.K.) | 7.5 part(s) |
| Pentaerythritol triacrylate ("Kayarad PET-30", Nihon Kayaku K.K.) | 7.5 part(s) |
| 2,4-Diethylthioxanthone ("Kayacure DETX", Nihon Kayaku) | 0.7 part(s) |
| Ethyl 4-dimethylaminobenzoate ("Kayacure EPA", Nihon Kayaku) | 0.7 part(s) |

The above ingredients were sufficiently mixed each other, and the resultant liquid was applied onto a 9 micron-thick polyester film support to obtain a silver salt-containing polymeric article otherwise in the same manner as in Example 11.

Then, a polytetrafluoroethylene tape ("Teflon Tape TOMBO 9001", Nichiasu K. K.) as a surface reforming medium was superposed on the silver salt-containing polymeric layer of the polymeric article, and the superposed structure was passed through hot rollers at 70° C. to form a laminate.

Then, a negative mask was aligned on the polyester film support of the laminate, and imagewise exposure and thermal development were performed similarly as in Example 11. Then, the laminate was placed on a hot plate at 75° C. and subjected to 25 sec of whole-area exposure to fluorescent light having a peak at 380 nm from a fluorescent lamp to form a polymerization image in the polymeric layer. Then, after removing the surface reforming medium, the silver salt-containing polymeric article was subjected 60 seconds of further whole-area exposure by using the above fluorescent lamp and hot plate to form a printing plate according to the present invention.

The resultant lithographic plate showed contact angles of 95 degrees and 20 degrees at parts polymerized in the presence and in the absence, respectively, of the surface reforming medium.

Then, the lithographic plate was used for printing in the same manner as in Example 11 whereby black images with little fog at the non-image part were obtained similarly as in Example 13.

EXAMPLE 15

| | |
|---|---|
| Silver bromide | 0.6 part(s) |
| Silver behenate | 5.0 part(s) |
| Behenic acid | 2.0 part(s) |
| Phthalazinone | 0.8 part(s) |
| 1,1'-Bis(2-hydroxy-3,5-dimethylphenyl)-3,3-dimethylpropane | 2.5 part(s) |
| 1-Carboxymethyl-5-[(3-ethyl-naphtho[1,2-d]oxazoline-2-indene)-dethylidene]-3-ethylthiohydantoin | 0.001 part(s) |
| Xylene/n-butanol (1/1) | 90 part(s) |
| Polyvinyl butyral resin ("Eslec BM-2", Sekisui Kagaku K.K.) | 3.0 part(s) |
| Acrylic resin ("Dianol BR-77", Mitsubishi Rayon K.K.) | 3.0 part(s) |
| Dipentaerythritol hexaacrylate ("Kayarad DPHA", Nihon Kayaku) | 3.0 part(s) |
| Benzyl dimethyl ketal ("Irgacure 651", Ciba-Geigy Corp.) | 0.3 part(s) |

A silver salt-containing polymeric article was prepared by using the above composition, otherwise in the same manner as in Example 11.

Then, the surface reforming medium comprising a coating layer containing an acrylonitrilepolyoxyalkylene copolymer on a polyester film used in Example 13 was superposed on the polymeric layer of the silver salt-containing polymeric article prepared above, and the superposed structure was passed through hot rollers at 50° C. to form a laminate.

Then, the laminate was subjected to imagewise exposure by using a drum scan-type laser beam printer (mfd. by Abe Sekkei K. K.) equipped with an He—Ne laser (output: 5 mW), then heated for 5 sec. at 125° C. to form a silver image at the exposed parts of the silver salt-containing polymeric layer, and then subjected to 20 sec of whole-area exposure on a hot plate at 75° C. to fluorescent light having a peak at 340 nm from a fluorescent lamp 3 cm spaced apart to polymerize the part of the silver salt-containing polymeric layer except for the parts with the silver image to obtain a polymerization image. Then, the surface reforming medium was peeled off, and the remaining silver salt-containing polymeric article was subjected to additional 90 sec of whole-area exposure from a distance of 3 cm by using the above fluorescent lamp and hot plate, to obtain a printing plate.

The resultant lithographic plate showed contact angles of 16 degrees and 90 degrees at parts polymerized in the presence and in the absence, respectively, of the surface reforming medium.

Then, the lithographic plate was used for printing in the same manner as in Example 11 whereby black images with little fog at the non-image parts were obtained similarly as in Example 13.

EXAMPLE 16

A silver salt-containing polymeric article was prepared in the same manner as in Example 15 except that the polyvinyl butyral resin was replaced by a different type of polyvinyl butyral resin ("BX-1", Mitsubishi Rayon K. K.).

Then, the preparation of the printing plate in Example 15 was followed up to the separation of the surface reforming medium. Separately, an additional surface reforming medium (surface reforming medium (B)) was prepared by coating a 9 micron-polyester film with a 1 micron-thick layer of fluorine-containing resin ("Fluorad FC-721", Sumitomo 3M K. K.). Then, the surface reforming medium (B) was further laminated onto the polymeric layer having a polymerization image of the silver salt-containing polymeric article by using hot rollers at 50° C., followed by 90 sec. of whole-area exposure by the fluorescent lamp, and the separation of the surface reforming medium (B) similarly as in Example 15, to obtain a printing plate.

The result lithographic plate showed contact angles of 16 degrees and 120 degrees at the parts polymerized in contact with the first surface reforming medium and the surface reforming medium (B), respectively.

The lithographic plate was then used for printing in the same manner as in Example 11, whereby sharp black images free from fog were obtained.

EXAMPLE 17

A printing plate was prepared in the same manner as in Example 16, except for exchanging the order of two types of surface reforming media, i.e., first by using the surface reforming medium (B) having a coating layer of fluorine-containing resin for the imagewise exposure, thermal development and whole-area exposure, and then using the surface reforming medium having a coating layer containing the acrylnitrilepolyoxyalkylene copolymer for whole-area exposure. The resultant printing plate showed contact angles of 120 degrees and 16 degrees at the reversed image parts.

As a result of printing, the lithographic provided sharp black images free from fog similarly as in Example 16 while the images were in a negative-positive inverted pattern with those in Example 16.

EXAMPLE 18

A printing plate was prepared in the same manner as in Example 16 except that the polyvinyl butyral resin was replaced by a different type of polyvinyl butyral resin having a higher Tg (glass transition point) ("KS-I", Mitsubishi Rayon K. K.).

The thus produced lithographic plate showed contact angles of 16 degrees and 120 degrees at the parts polymerized in contact with the first surface reforming medium and the second surface reforming medium, respectively.

The lithographic plate was used for printing in the same manner as in Example 11, whereby sharp black images free from fog were obtained similarly as in Example 16.

EXAMPLE 19

Silver halide particles consisting of 75 mol. of silver chloride, 24.5 mol. % of silver bromide and 0.5 mol. % of silver iodide were formulated together with gelatin, and then subjected to sulfur-sensitization and gold-sensitization according to ordinary methods. The silver halide particles showed an average particle size of 0.20 micron. A merocyanine dye showing a maximum sensitivity at 550 mu was added as a sensitizing dye and tolylene 2,4-diisocyanate was added as a hardening agent in an amount of about 0.5 g per 100 g of gelatin, followed further by addition of appropriate stabilizer and surfactant to obtain a photosensitive liquid (I).

Then, a coating liquid was formulated by using the photosensitive liquid (I) as follows:

| | |
|---|---|
| Photosensitive liquid (I) | 1 part(s) |
| Polyvinyl alcohol | 1 part(s) |
| ("Gosenol NH-18", mfd. by Nihon Gosei Kagaku K.K.) | |
| Pentaerythritol triacrylate | 1 part(s) |
| ("Kayacure DETX", mfd. by Nihon Kayaku K.K.) | |
| Ethyl 4-dimethylaminobenzoate | 0.1 part(s) |
| ("Kayacure EPA", mfd. by Nihon Kayaku K.K.) | |
| Water/n-butanol | 10 part(s) |

The coating liquid was applied by an applicator onto a 50 micron-thick polyester film to provide a 5 micron-thick silver salt-containing polymeric layer containing 0.3 g each of gelatin and silver per m².

Onto the silver salt-containing polymeric article thus prepared, the surface reforming medium (B) prepared in Example 16 was laminated similarly as in Example 16, followed by placement of a negative mask thereon, 1 sec. of imagewise exposure from a tungsten lamp 5 cm spaced apart, separation of the negative mask, and 4 min. of dipping of the laminate in a developing liquid having the following composition at 40° C.:

| | |
|---|---|
| p-Methoxy phenol | 12 part(s) |
| Sodium sulfite | 7 part(s) |
| Sodium carbonate | 5 part(s) |
| Potassium bromide | 0.1 part(s) |
| β-acetylphenylhydrazine | 0.3 part(s) |
| Water | 1000 part(s) |
| (Sodium hydroxide for adjustment of pH 10) | |

Then, the laminate was subjected to whole-area exposure similarly as in Example 14, peeling-off of the surface reforming medium and then additional whole-area exposure similarly as in Example 14 to prepare a printing plate according to the present invention.

The thus produced lithographic plate showed contact angles of 120 degrees and 22 degrees at the parts polymerized in the presence and in the absence, respectively, of the surface reforming medium.

The lithographic plate was used for printing in the same manner as in Example 11, whereby sharp black images free from fog at the non-image parts were obtained similarly as in Example 16.

EXAMPLE 20

| | |
|---|---|
| Polyvinyl butyral resin | 1 part(s) |
| ("Eslec BL-2", Sekisui Kagaku K.K.) | |
| Trimethylolpropane triacrylate | 1 part(s) |
| ("Kayarad TMPTA", Nihon Kayaku K.K.) | |
| 2,4-Diethylthioxanthone | 0.2 part(s) |
| ("Kayacure DETX", Nihon Kayaku K.K.) | |
| Ethyl 4-dimethylaminobenzoate | 0.2 part(s) |
| ("Kayacure EPA", Nihon Kayaku K.K.) | |
| n-Butyral | 16 part(s) |

A liquid having the above composition was prepared and applied by an applicator onto a 100 micron-thick polycarbonate film ("Panlite", Teijin Kasei K. K.) in a dry thickness of 10 microns to form a polymeric article.

Separately, a 9 micron-thick polyester film ("Lumirror", Toray K. K.) was coated by application using an applicator with a 1 micron-thick fluorine-containing resin ("Fluorad FC-721", Sumitomo 3M K. K.) to obtain a surface reforming medium.

Then, the above-prepared polymeric article was covered with a negative mask in alignment and exposed for 0.1 sec under application of a thermal bias at 70° C. to fluorescent light having a peak at 380 nm from a fluorescent lamp 3 cm spaced apart, thereby to form a polymerization image.

Then, after removal of the negative film, the polymeric article was heated at 50° C. fine powdery silica ("Aerosil 200", Nihon Aerosil K. K.) was dispersed on the polymeric article, and the polymeric article was passed through rollers exerting a nip pressure for embedding a part or whole of the silica powder at the un-polymerized parts of the polymeric layer.

Then, the polymeric article was subjected to whole-area exposure under application of a thermal bias at 105° C. by using the fluorescent lamp used in the polymerization image formation to fix the powder silica in the polymeric layer, followed by removal of excessive silica, to obtain a printing plate according to the present invention.

The printing plate showed contact angles of 5 degrees at the powdery silica attached parts and 120 degrees at the silica non-attached parts, i.e., the parts surface-modified by polymerization in contact with the surface reforming medium.

The thus obtained lithographic plate was fixed about the plate cylinder of a desktop-type offset printer ("San-Offset" (trade name), mfd. by San Insatsu Kikai K. K.), and printing was performed on paper by using an oily ink ("Offset Ink New Rubber Black", Bunshodo K. K.) and dampening water (6-times dilution of an etch liquid available from Gestetner Ltd.), whereby sharp and good images were obtained.

EXAMPLE 21

A printing plate according to the present invention was prepared in the same manner as in Example 20 except that the polyvinyl butyral resin used for the polymeric article production was replaced by a polyvinyl butyral resin having a different polymerization degree ("Eslec BX-1", Sekisui Kagaku K. K.), the powdery silica was replaced by natural mineral powder ("Muki Smectone", Kunimine Kogyo K. K.), and a polytetrafluoroethylene film ("Teflon Tape TOMBO 9001", Nichiasu K. K.) was used as the surface reforming medium, and the exposure was performed through a negative mask disposed on the support of the polymeric article.

The printing plate showed contact angles of 6 degrees at the powder attached parts and 105 degrees at the powder non-attached parts, i.e., the parts surface-reformed by polytetrafluoroethylene.

The printing plate was used for printing in the same manner as in Example 20, whereby sharp images were obtained similarly as in Example 20. The printing speed was 120 sheets/min.

EXAMPLE 22

A printing plate according to the present invention was prepared in the same manner as in Example 20 except that the powdery silica was replaced by water-repellent polytetrafluoroethylene powder ("Lubron L-2", Daikin Kogyo K. K.) and the surface reforming medium was replaced by the one used in Example 10.

The printing plate showed contact angles of 104 degrees at the powder attached parts and 20 degrees at the powder non-attached parts.

The printing plate was used for printing in the same manner as in Example 20, whereby white-black inverted images with respect to those in Example 20 were obtained.

EXAMPLE 23

| | |
|---|---|
| Silver bromide | 0.6 part(s) |
| Silver behenate | 5.0 part(s) |
| Behenic acid | 2.0 part(s) |
| Phthalazinone | 0.8 part(s) |
| 1,1'-Bis(2-hydroxy-3,5-dimethyl-phenyl)-3,3-dimethylpropane | 2.5 part(s) |
| 1-Carboxymethyl-5-[(3-ethyl-naphtho[1,2-d]oxazoline-2-indene)-dethylidene]-3-ethylthiohydantoin | 0.001 part(s) |
| Xylene/n-butanol (1/1) | 90 part(s) |
| Polyvinyl butyral resin ("Eslec BM-2", Sekisui Kagaku K.K.) | 3.0 part(s) |
| Acrylic resin ("Dianal BR-77", Mitsubishi Rayon K.K.) | 3.0 part(s) |
| Dipentaerythritol hexaacrylate ("Kayarad DPHA", Nihon Kayaku) | 3.0 part(s) |
| Benzyl dimethyl ketal ("Irgacure 651", Ciba-Geigy Corp.) | 0.3 part(s) |

A silver salt-containing polymeric article was prepared by using the above composition, otherwise in the same manner as in Example 20.

Then, the surface reforming medium comprising a coating layer of a fluorine-containing resin on a polyester film used in Example 20 was superposed on the polymeric layer of the silver salt-containing polymeric article prepared above, and the superposed structure was passed through hot rollers at 50° C. to form a laminate.

Then, the laminate was subjected to imagewise exposure by using a drum scan-type laser beam printer (mfd. by Abe Sekkei K. K.) equipped with an He—Ne laser (output: 5 mW), then heated for 5 sec. at 125° C. to form a silver image at the exposed parts of the silver salt-containing polymeric layer, and then subjected to 20 sec of whole-area exposure on a hot plate at 70° C. to fluorescent light having a peak at 340 nm from a fluorescent lamp 3 cm spaced apart to polymerize the part of the silver salt-containing polymeric layer except for the parts with the silver image to obtain a polymerization image. Then, the surface reforming medium was peeled off.

Then, the silica fine powder used in Example 20 was dispersed on the remaining silver salt-containing polymeric article, and the polymeric article was was passed through rollers exerting a nip pressure for embedding a part or whole of the silica powder at the un-polymerized parts of the polymeric layer. Then, the polymeric article was subjected to whole-area exposure by using the fluorescent lamp and the hot plate used in the polymerization image formation to fix the powder silica in the polymeric layer, followed by removal of excessive silica, to obtain a printing plate according to the present invention.

The printing plate showed contact angles of 5 degrees at the powder attached parts and 120 degrees at the powder non-attached parts.

The printing plate was used for printing in the same manner as in Example 20, whereby good and sharp images were obtained similarly as in Example 20.

EXAMPLE 24

A coating liquid was formulated by using the photosensitive liquid (I) prepared in Example 19 as follows:

| | |
|---|---|
| Photosensitive liquid (I) | 1 part(s) |
| Polyvinyl alcohol ("Gosenol NH-18", mfd. by Nihon Gosei Kagaku K.K.) | 1 part(s) |
| Pentaerythritol triacrylate ("Kayacure DETX", mfd. by Nihon Kayaku K.K.) | 1 part(s) |
| Trimethylolpropane triacrylate ("Kayacure TMPTA", mfd. by Nihon Kayaku K.K.) | 0.3 part(s) |
| 2,4-Diethylthioxanethone ("Kayacure DETX", mfd. by Nihon Kayaku K.K.) | 0.1 part(s) |
| Ethyl 4-dimethylaminobenzoate | 0.1 part(s) |

-continued ("Kayacure EPA", mfd. by Nihon Kayaku K.K.)
Water/n-butanol                                          10 part(s)

The coating liquid was applied by an applicator onto a 50 micron-thick polyester film to provide a 5 micron-thick silver salt-containing polymeric layer containing 0.3 g each of gelatin and silver per m².

Onto the silver salt-containing polymeric article thus prepared, a negative mask similar to the one used in Example 20 was placed, followed by 1 sec. of imagewise exposure from a tungsten lamp 5 cm spaced apart, separation of the negative mask, and 4 min. of dipping of the polymeric article in a developing solution having the following composition at 40° C.:

| | |
|---|---|
| p-Methoxy phenol | 12 part(s) |
| Sodium sulfite | 7 part(s) |
| Sodium carbonate | 5 part(s) |
| Potassium bromide | 0.1 part(s) |
| β-acetylphenylhydrazine | 0.3 part(s) |
| Water | 1000 part(s) |
| (Sodium hydroxide for adjustment of pH 10) | |

Then, the surface reforming medium used in Example 22 was placed on the above-developed silver salt-containing polymeric layer of the polymeric article, and laminated similarly as in Example 22. further, the silver salt-containing polymeric article was subjected to whole-area exposure similarly as in Example 20 and peeling-off of the surface reforming medium, followed further by dispersion of polytetrafluoroethylene powder similarly as in Example 22 and additional whole-area exposure, to prepare a printing plate according to the present invention.

The printing plate showed contact angles of 104 degrees at the powder attached parts and 20 degrees at the powder non-attached parts.

The printing plate was used for printing in the same manner as in Example 20, whereby white-black inverted images with respect to those in Example 20 were obtained.

EXAMPLE 25

| | |
|---|---|
| Polyvinyl butyral resin | 1 part(s) |
| ("Eslec BL-2", Sekisui Kagaku Kogyo K.K.) | |
| Trimethylolpropane triacrylate | 1 part(s) |
| ("Aronix M-309", Toa Gosei Kagaku K.K.) | |
| 3,3'-Carbonylbis(7-dethylaminocoumarin) | 0.3 part(s) |
| Ethyl 4-dethylaminobenzoate | 0.2 part(s) |
| ("Kayacure EPA", Nihon Kayaku K.K.) | |
| 1-Nitroso-2-naphthol | 0.001 part(s) |
| n-Butanol | 13 part(s) |

A liquid having the above composition was applied by an applicator onto a 100 micron-thick polycarbonate film to form a polymerization layer in a dry thickness of 5–6 microns, on which the surface reforming medium used in Example 10 was laminated similarly as in Example 6.

Separately, a liquid dispersion having the following dispersion was prepared.

| | |
|---|---|
| Silver bromide | 2.0 part(s) |
| Silver behenate | 5.0 part(s) |
| Behenic acid | 2.3 part(s) |
| Phthalazinone | 2.0 part(s) |
| 2-Methyl-4-(3,5-dimethyl-4-hydroxybenzyl)naphthol | 2.31 part(s) |
| Polyvinyl butyral resin | 10.0 part(s) |
| ("Eslec BM-2, Sekisui Kagaku K.K.) | |
| Xylene/n-butanol (1/1) | 100 part(s) |

Into the above liquid dispersion, 0.006 part of 3,3'-diethyl-2,2'-thiatricarbocyanine iodide and 1.0 part of N,N-diethylformamide were added and sufficiently dissolved and mixed. The resultant liquid was applied onto a 50 micron-thick polyester by an applicator to form a 5 micron-photosensitive silver salt layer, which was subjected to imagewise exposure by a semiconductor laser (780 nm, 10 mW) and to 10 sec. of thermal development at 100° C.

After the thermal development, the photosensitive silver salt layer was superposed onto the above-prepared surface reforming medium in lamination with the polymerization layer, and the superposed structure was placed on a hot plate heated at 85° C. and subjected to 20 sec. of polymerization exposure to fluorescent light having a peak at 420 nm from a fluorescent lamp 3 cm spaced apart from the polyester film. Thereafter, the surface reforming medium and the photosensitive silver salt layer peeled off from the polymerization layer, and the remaining polymerization layer was further subjected to 60 sec. of whole-area exposure by using the above fluorescent lamp and hot plate, thereby to obtain a printing plate according to the present invention.

The printing plate showed contact angles of 20 degrees and 78 degrees at parts polymerized in the presence and in the absence, respectively, of the surface reforming medium.

Then, the lithographic plate was used for printing in the same manner as in Example 11 whereby black images were obtained similarly as in Example 11.

EXAMPLE 26

A laminate of the polycarbonate film, the polymerization layer and the surface reforming medium was prepared by using the same materials and in the same manner as in Example 25. Further, a 5 micron-thick photosensitive silver salt layer of the same composition as in Example 26 was formed on the polycarbonate film, and further coated with a 2 micron-thick protective layer of polyvinyl alcohol ("Gosenol NH-17Q", Nihon Gosei Kagaku K. K.) by application with an applicator.

The resultant laminate was further subjected to imagewise exposure, thermal development and polymerization similarly as in Example 25, followed further by separation of the surface reforming medium and whole-area exposure to obtain a printing plate according to the present invention.

The printing plate showed contact angles of 20 degrees and 78 degrees at parts polymerized in the presence and in the absence, respectively, of the surface reforming medium.

Then, the lithographic plate was used for printing in the same manner as in Example 11 whereby black images were obtained similarly as in Example 11.

COMPARATIVE EXAMPLE 1

A 50 micron-thick polyester film was coated with a 10 wt. % solution in methyl ethyl ketone of the polyvinyl butyral resin used in Example 1 by an applicator to form a polyvinyl butyral resin layer in a thickness of 5–6 microns. The polyvinyl butyral resin layer showed a contact angle of 60 degrees.

Then, a 50 micron-thick polytetrafluoroethylene film identical to the one used in Example 1 was laminated onto the above polyvinyl butyral resin layer at a nip pressure of 0.2 kg/cm$^2$ and a temperature of 80° C. Then, the resultant laminate was subjected to exposure under heating similarly as in Example 1.

Then, the polytetrafluoroethylene film was peeled off and the remaining polyvinyl butyral resin layer was subjected to the ESCA surface analysis whereby the fluorine peak could not be confirmed as to whether the peak was very small or not present because the observed peak was comparable with the background noise. As a result, quantitative analysis was impossible at all. The polyvinyl butyral resin layer at this stage showed a contact angle of 60 degrees, which was not changed from the value obtained before the lamination of the polytetrafluoroethylene film.

Further, another sample of the above-prepared laminate was subjected to mere peeling-off of the polytetrafluoroethylene, i.e., without further exposure under heating before the peeling. The ESCA surface analysis of the remaining polyvinyl butyral resin layer gave the same result as above regarding a fluorine peak, which was not present or was very small, if any, and could not be confirmed. The polyvinyl butyral resin layer in this instance also showed a contact angle of 60 degrees resulting in no change.

What is claimed is:

1. A surface reforming method, comprising sequentially:
   (i) a step of separately providing a surface reforming medium, and a silver salt-containing polymeric article supported on a support and comprising at least a polymerizable compound and a photosensitive silver salt compound,
   (ii) a step of subjecting the silver salt-containing polymeric article to imagewise exposure to light,
   (iii) a step of causing the surface reforming medium to contact the silver salt-containing polymeric article after the imagewise exposure,
   (iv) a step of polymerizing the silver salt-containing polymeric article, and
   (v) a step of peeling the surface reforming medium from the silver salt-containing polymeric article, so that a fraction of the surface reforming medium is materially transferred to the polymerized polymeric article.

2. A method according to claim 1, wherein after the step of separating the surface reforming medium, the silver salt-containing polymeric article is allowed to retain an un-polymerized part, to which powder is then attached.

3. A method according to claim 1, wherein said surface reforming medium comprises a resin selected from the group consisting of fluorine-containing resin, silicone resin, vinylidene chloride resin, and vinyl chloride resin.

4. A surface reforming method, comprising sequentially:
   (i) a step of separately providing a surface reforming medium, and a photosensitive silver salt layer supported on a support and comprising at least a photosensitive silver salt component,
   (ii) a step of subjecting the photosensitive silver salt layer to imagewise exposure to light,
   (iii) a step of subjecting the photosensitive silver salt layer to thermal development,
   (iv) a step of superposing a polymerization layer comprising at least a polymerizable compound on the photosensitive silver salt layer and superposing the surface reforming medium on the polymerization layer,
   (v) a step of polymerizing the polymerization layer, and
   (vi) a step of peeling the surface reforming medium from the polymerization layer so that a fraction of the surface reforming medium is materially transferred to the polymerized polymerization layer.

5. A method according to claim 4, wherein after the step of separating the surface reforming medium, the polymerization layer is allowed to retain an un-polymerized part, to which powder is then attached.

6. A method according to claim 4, wherein said surface reforming medium comprises a resin selected from the group consisting of fluorine-containing resin, silicone resin, vinylidene chloride resin, and vinyl chloride resin.

7. A process for producing a printing plate, comprising sequentially:
   (i) a step of separately providing a surface reforming medium, and a photosensitive silver salt layer supported on a support and comprising at least a photosensitive silver salt component,
   (ii) a step of subjecting the photosensitive silver salt layer to imagewise exposure to light,
   (iii) a step of subjecting the photosensitive silver salt layer to thermal development,
   (iv) a step of superposing a polymerization layer comprising at least a polymerizable compound on the photosensitive silver salt layer and superposing a surface reforming medium on the polymerization layer,
   (v) a step of locally selectively polymerizing the polymerization layer while leaving an unpolymerized part, and
   (vi) a step of peeling the surface reforming medium from the polymerization layer so that a fraction of the surface reforming medium is materially transferred to the polymerized polymerization layer to provide the polymerization layer with a pattern of different wettability with water.

8. A process according to claim 7, wherein said surface reforming medium comprises a resin selected from the group consisting of fluorine-containing resin, and silicone resin.

* * * * *

UNITED STATES PATENT AND TRADEMARK OFFICE
CERTIFICATE OF CORRECTION

PATENT NO. : 5,599,648

DATED : February 4, 1997

INVENTOR(S) : YUJI KONDO ET AL.

It is certified that error appears in the above-identified patent and that said Letters Patent is hereby corrected as shown below:

On the title page, item:

[56] REFERENCES CITED

Foreign Patent Documents,
"39978" should read --69978--.

COLUMN 2

Line 2, "an" should read --a--.
Line 13, "and" should read --or--.
Line 23, "a" should be deleted.
Line 50, "Driography" should read --driography--.

COLUMN 3

Line 11, "lacked" should read --lacking,--.
Line 12, "to cause" should read --thereby causing--.
Line 22, "entire" should read --entire surface--.

COLUMN 4

Line 31, "a" should be deleted.

COLUMN 5

Line 67, "and" should read --or--.

COLUMN 6

Line 14, "a" should be deleted.
Line 16, "In case" should read --In the case--.

UNITED STATES PATENT AND TRADEMARK OFFICE
CERTIFICATE OF CORRECTION

PATENT NO.   :   5,599,648
DATED        :   February 4, 1997
INVENTOR(S)  :   YUJI KONDO ET AL.

It is certified that error appears in the above-identified patent and that said Letters Patent is hereby corrected as shown below:

COLUMN 7

Line 13, "m" should read --to--.
Line 26, "differently" should read --different--.
Line 33, "in case" should read --in a case--.

COLUMN 8

Line 62, "azobis-secamylonitrile," should read --azobissecamylonitrile," and "azobixcy-" should read --azobiscy- --.

COLUMN 9

Line 33, "4,4'-(diethylaminobenzophenone," should read --4,4'-diethylaminobenzophenone,--.
Line 52, "combination" should read --a combination--.
Line 50, "combination" should read --a combination--.

COLUMN 10

Line 50, "a" should read --an--.

COLUMN 11

Line 6, "polytetrafluoroethytene," should read --polytetrafluoroethylene,--.
Line 14 "hydropholocity" should read --hydrophilicity--.
Line 36, "per" should read --per se--.

UNITED STATES PATENT AND TRADEMARK OFFICE
CERTIFICATE OF CORRECTION

PATENT NO. : 5,599,648
DATED : February 4, 1997
INVENTOR(S) : YUJI KONDO ET AL.

It is certified that error appears in the above-identified patent and that said Letters Patent is hereby corrected as shown below:

COLUMN 12

Line 2, "material" should read --materials--.
Line 61, "initiator. The" should read
--initiator, the--.

COLUMN 17

Line 8, "(or m or o)aminophenol," should read
--(or m or o)-aminophenol,--.
Line 51, "ai" should read --a--.

COLUMN 18

Line 32, "some" should read --the--.
Line 37, "present," should read --present--.

COLUMN 20

Line 4, "are" should read --is--.
Line 23, "is" should read --are--.
Line 25, "removal" should read --is removed--.
Line 63, "resin," should read --resins-.

COLUMN 21

Line 16, "powder" should read --powders--.
Line 23, "respects" should read --respect--.
Line 26, "are" should read --is--.

UNITED STATES PATENT AND TRADEMARK OFFICE
CERTIFICATE OF CORRECTION

PATENT NO. : 5,599,648
DATED : February 4, 1997
INVENTOR(S) : YUJI KONDO ET AL.

It is certified that error appears in the above-identified patent and that said Letters Patent is hereby corrected as shown below:

COLUMN 22

Line 61, "another-type," should read --another type,--.

COLUMN 23

Line 1, "into" should read --to--.
Line 2, "the" (2nd. Occ.) should be deleted
Line 5, "into" should read --to--.
Line 17, "oil. the" should read --oil. The-- and "include:" should read --be:--.
Line 40, "pigments," should read --pigments--.

COLUMN 24

Line 38, "and" should read --and an--.
Line 47, "examples," should read --Examples,--.
Line 48, "dark room" should read --darkroom--.

COLUMN 25

Line 4, "(Hereinafter" should read --(hereinafter--.
Line 6, "rather" should be deleted.

COLUMN 28

Line 56, "The, the" should read --the--.

COLUMN 29

Line 61, "then," should read --Then,--.
Line 65, "space" should read --spaced--.

UNITED STATES PATENT AND TRADEMARK OFFICE
CERTIFICATE OF CORRECTION

PATENT NO. : 5,599,648

DATED : February 4, 1997

INVENTOR(S) : YUJI KONDO ET AL.

It is certified that error appears in the above-identified patent and that said Letters Patent is hereby corrected as shown below:

COLUMN 30

Line 2, "subject" should read --subjected--.
Line 31, "applicator" should read --applicator to--.

COLUMN 31

Line 22, "mixed" should read --mixed with--.

COLUMN 32

Line 27, "the part of" should be deleted.
Line 31, "to" should read --to an--.
Line 54, "micron-polyester" should read --micron-thick polyester--.

COLUMN 33

Line 13, "medium" should read --medium (A)--.
Line 17, "lithographic" should read --lithographic plate--.
Line 19, "pattern" should read --pattern as--.
Line 40, "mol." should rad --mol. %--.

COL. 34 Line 60, "C." should read --C.,--.

COLUMN 36

Line 29, "the part of" should be deleted.

COLUMN 37

Line 28, "22. further" should read --22. Further--.

UNITED STATES PATENT AND TRADEMARK OFFICE
CERTIFICATE OF CORRECTION

PATENT NO. : 5,599,648
DATED : February 4, 1997
INVENTOR(S) : YUJI KONDO ET AL.

It is certified that error appears in the above-identified patent and that said Letters Patent is hereby corrected as shown below:

COLUMN 38

Line 5, "("Eslec BM-2," should read --("Eslec BM-2",--.
Line 12, "polyester" should read --polyester film-- and "micron-photo" should read --micron-thick--.
Line 13, "sensitive" should read --photosensitive--.
Line 24, "layer" should read --layer was--.

COLUMN 39

Line 13, "impossible at all." should read --impossible.--.

COLUMN 40

Line 52, "resin," should read --resin--.

Signed and Sealed this

Ninth Day of September, 1997

BRUCE LEHMAN

*Attest:*

*Attesting Officer*       Commissioner of Patents and Trademarks